(12) United States Patent
Smargiassi et al.

(10) Patent No.: US 9,384,959 B2
(45) Date of Patent: ***Jul. 5, 2016

(54) PURGING OF POROGEN FROM UV CURE CHAMBER

(71) Applicant: Novellus Systems, Inc., San Jose, CA (US)

(72) Inventors: Eugene Smargiassi, Tualatin, OR (US); Stephen Yu-Hong Lau, Lake Oswego, OR (US); George D. Kamian, Scotts Valley, CA (US); Ming Xi, Palo Alto, CA (US)

(73) Assignee: Novellus Systems, Inc., San Jose, CA (US)

( * ) Notice: Subject to any disclaimer, the term of this patent is extended or adjusted under 35 U.S.C. 154(b) by 134 days.

This patent is subject to a terminal disclaimer.

(21) Appl. No.: 14/260,897

(22) Filed: Apr. 24, 2014

(65) Prior Publication Data

US 2014/0230861 A1    Aug. 21, 2014

Related U.S. Application Data

(60) Continuation of application No. 13/944,421, filed on Jul. 17, 2013, now Pat. No. 8,734,663, which is a continuation of application No. 13/562,421, filed on Jul. 31, 2012, now Pat. No. 8,518,210, which is a (Continued)

(51) Int. Cl.
  *C23C 16/00*    (2006.01)
  *H01L 21/02*    (2006.01)
  *H01L 21/67*    (2006.01)

(52) U.S. Cl.
  CPC .... *H01L 21/02041* (2013.01); *H01L 21/67017* (2013.01); *H01L 21/02203* (2013.01); *H01L 21/02348* (2013.01)

(58) Field of Classification Search
  CPC .......................... B08B 15/00; H01L 21/67017
  USPC ........................................................ 118/715
  See application file for complete search history.

(56) References Cited

U.S. PATENT DOCUMENTS 3,504,181 A    3/1970    Campbell et al.
3,612,825 A    10/1971   Chase et al.

(Continued)

FOREIGN PATENT DOCUMENTS

JP    62229833    10/1987
JP    01107519    4/1989

(Continued)

OTHER PUBLICATIONS

U.S. Appl. No. 13/132,559, filed Jun. 3, 2008, Gytri et al.

(Continued)

*Primary Examiner* — Keath Chen

(57) ABSTRACT

A purge ring for providing a gas to a wafer processing chamber includes an inlet ring wall defining a ring hole space. An outer perimeter of the inlet ring wall is elliptical. An outer perimeter of the ring hole space is circular. The inlet ring wall is a continuous structure surrounding the ring hole space. An inlet baffle formed within the inlet ring wall surrounds at least 180 degrees of the outer perimeter of the ring hole space. An inlet plenum arranged in a first end of the inlet ring wall provides the gas to the ring hole space through the inlet baffle. An exhaust channel is formed within the inlet ring wall in a second end of the inlet ring wall. An exhaust outlet hole arranged in the second end of the inlet ring wall exhausts the gas out of the ring hole space via the exhaust channel.

9 Claims, 10 Drawing Sheets

Related U.S. Application Data continuation of application No. 12/586,175, filed on Sep. 18, 2009, now Pat. No. 8,282,768, which is a division of application No. 11/391,134, filed on Mar. 28, 2006, now abandoned, and a continuation-in-part of application No. 11/115,576, filed on Apr. 26, 2005, now Pat. No. 8,137,465.

(60) Provisional application No. 60/742,844, filed on Dec. 5, 2005.

(56) References Cited

U.S. PATENT DOCUMENTS

| | | | |
|---|---|---|---|
| 3,704,219 | A | 11/1972 | McDowell |
| 3,983,385 | A | 9/1976 | Troue |
| 4,357,451 | A | 11/1982 | McDaniel |
| 4,391,663 | A | 7/1983 | Hutter, III |
| 4,457,359 | A | 7/1984 | Holden |
| 4,527,620 | A | 7/1985 | Pedersen et al. |
| 4,535,835 | A | 8/1985 | Holden |
| 4,563,589 | A | 1/1986 | Scheffer |
| 4,654,226 | A | 3/1987 | Jackson et al. |
| 4,832,777 | A | 5/1989 | Davis et al. |
| 4,872,947 | A | 10/1989 | Wang et al. |
| 4,885,262 | A | 12/1989 | Ting et al. |
| 4,927,786 | A | 5/1990 | Nishida |
| 4,956,582 | A | 9/1990 | Bourassa |
| 4,960,488 | A | 10/1990 | Law et al. |
| 5,005,519 | A | 4/1991 | Egermeier et al. |
| 5,049,739 | A | 9/1991 | Okamoto |
| 5,113,929 | A | 5/1992 | Nakagawa et al. |
| 5,150,253 | A | 9/1992 | Watanuki |
| 5,166,101 | A | 11/1992 | Lee et al. |
| 5,174,881 | A | 12/1992 | Iwasaki et al. |
| 5,178,682 | A | 1/1993 | Tsukamoto et al. |
| 5,195,045 | A | 3/1993 | Keane et al. |
| 5,228,208 | A | 7/1993 | White et al. |
| 5,240,746 | A | 8/1993 | O'Connell Litteral |
| 5,268,320 | A | 12/1993 | Holler et al. |
| 5,282,121 | A | 1/1994 | Bornhorst et al. |
| 5,288,684 | A | 2/1994 | Yamazaki et al. |
| 5,298,939 | A | 3/1994 | Swanson et al. |
| 5,314,538 | A | 5/1994 | Maeda et al. |
| 5,354,715 | A | 10/1994 | Wang et al. |
| 5,407,524 | A | 4/1995 | Patrick et al. |
| 5,413,664 | A | 5/1995 | Yagi et al. |
| 5,426,076 | A | 6/1995 | Moghadam |
| 5,447,431 | A | 9/1995 | Muka |
| 5,504,042 | A | 4/1996 | Cho et al. |
| 5,518,959 | A | 5/1996 | Jang et al. |
| 5,552,927 | A | 9/1996 | Wheatly et al. |
| 5,556,549 | A | 9/1996 | Patrick et al. |
| 5,558,717 | A | 9/1996 | Zhao et al. |
| 5,582,880 | A | 12/1996 | Mochizuki et al. |
| 5,588,827 | A | 12/1996 | Muka |
| 5,614,252 | A * | 3/1997 | McMillan ............... B05D 1/00 257/E21.009 |
| 5,667,592 | A | 9/1997 | Boitnott et al. |
| 5,674,783 | A | 10/1997 | Jang et al. |
| 5,686,054 | A | 11/1997 | Barthel et al. |
| 5,700,844 | A | 12/1997 | Hedrick et al. |
| 5,755,886 | A | 5/1998 | Wang et al. |
| 5,766,365 | A | 6/1998 | Umotoy et al. |
| 5,789,027 | A | 8/1998 | Watkins et al. |
| 5,795,448 | A | 8/1998 | Hurwitt et al. |
| 5,800,686 | A | 9/1998 | Littau et al. |
| 5,811,762 | A | 9/1998 | Tseng |
| 5,833,290 | A | 11/1998 | Curelop et al. |
| 5,840,600 | A | 11/1998 | Yamazaki et al. |
| 5,851,715 | A | 12/1998 | Barthel et al. |
| 5,858,457 | A | 1/1999 | Brinker et al. |
| 5,858,715 | A | 1/1999 | Hillman et al. |
| 5,876,798 | A | 3/1999 | Vassiliev |
| 5,877,095 | A | 3/1999 | Tamura et al. |
| 5,962,085 | A | 10/1999 | Hayashi et al. |
| 5,994,678 | A | 11/1999 | Zhao et al. |
| 6,015,503 | A | 1/2000 | Butterbaugh et al. |
| 6,044,329 | A | 3/2000 | Kidd |
| 6,072,163 | A | 6/2000 | Armstrong et al. |
| 6,080,965 | A | 6/2000 | Osawa |
| 6,087,632 | A | 7/2000 | Mizosaki et al. |
| 6,098,637 | A | 8/2000 | Parke |
| 6,132,814 | A | 10/2000 | Livesay et al. |
| 6,136,680 | A | 10/2000 | Lai et al. |
| 6,140,252 | A | 10/2000 | Cho et al. |
| 6,143,063 | A | 11/2000 | Hayashi et al. |
| 6,150,272 | A | 11/2000 | Liu et al. |
| 6,159,299 | A | 12/2000 | Koai et al. |
| 6,167,834 | B1 | 1/2001 | Wang et al. |
| 6,200,634 | B1 | 3/2001 | Johnsgard et al. |
| 6,214,184 | B1 | 4/2001 | Chien et al. |
| 6,228,438 | B1 | 5/2001 | Schmitt |
| 6,228,563 | B1 | 5/2001 | Starov et al. |
| 6,232,248 | B1 | 5/2001 | Shinriki et al. |
| 6,235,112 | B1 | 5/2001 | Satoh |
| 6,239,018 | B1 | 5/2001 | Liu et al. |
| 6,242,717 | B1 | 6/2001 | Sanderson |
| 6,244,575 | B1 | 6/2001 | Vaartstra et al. |
| 6,254,689 | B1 | 7/2001 | Meder |
| 6,259,061 | B1 | 7/2001 | Osawa |
| 6,268,288 | B1 | 7/2001 | Hautala et al. |
| 6,271,273 | B1 | 8/2001 | You et al. |
| 6,284,050 | B1 | 9/2001 | Shi et al. |
| 6,288,493 | B1 | 9/2001 | Lee et al. |
| 6,291,800 | B1 | 9/2001 | Shirakawa et al. |
| 6,307,184 | B1 | 10/2001 | Womack et al. |
| 6,329,017 | B1 | 12/2001 | Liu et al. |
| 6,340,628 | B1 | 1/2002 | Van Cleemput et al. |
| 6,365,266 | B1 | 4/2002 | MacDougall et al. |
| 6,383,466 | B1 | 5/2002 | Domansky et al. |
| 6,383,955 | B1 | 5/2002 | Matsuki et al. |
| 6,386,466 | B1 | 5/2002 | Ozawa et al. |
| 6,387,453 | B1 | 5/2002 | Brinker et al. |
| 6,391,932 | B1 | 5/2002 | Gore et al. |
| 6,392,017 | B1 | 5/2002 | Chandrashekar |
| 6,394,797 | B1 | 5/2002 | Sugaya et al. |
| 6,399,212 | B1 | 6/2002 | Sakai et al. |
| 6,413,321 | B1 | 7/2002 | Kim et al. |
| 6,420,441 | B1 | 7/2002 | Allen et al. |
| 6,444,715 | B1 | 9/2002 | Mukherjee et al. |
| 6,467,491 | B1 | 10/2002 | Sugiura et al. |
| 6,475,854 | B2 | 11/2002 | Narwankar et al. |
| 6,479,374 | B1 | 11/2002 | Ioka et al. |
| 6,479,409 | B2 | 11/2002 | Shioya et al. |
| 6,485,599 | B1 | 11/2002 | Glownia et al. |
| 6,497,783 | B1 | 12/2002 | Suzuki et al. |
| 6,518,130 | B1 | 2/2003 | Ohno |
| 6,519,036 | B1 | 2/2003 | Hickman |
| 6,524,389 | B1 | 2/2003 | Katayama et al. |
| 6,530,380 | B1 | 3/2003 | Zhou et al. |
| 6,531,193 | B2 | 3/2003 | Fonash et al. |
| 6,534,395 | B2 | 3/2003 | Werkhoven et al. |
| 6,548,113 | B1 | 4/2003 | Birnbaum et al. |
| 6,558,755 | B2 | 5/2003 | Berry, III et al. |
| 6,559,424 | B2 | 5/2003 | O'Carroll et al. |
| 6,563,092 | B1 | 5/2003 | Shrinivasan et al. |
| 6,568,346 | B2 | 5/2003 | Pu et al. |
| 6,576,300 | B1 | 6/2003 | Berry, III et al. |
| 6,596,654 | B1 | 7/2003 | Bayman et al. |
| 6,629,012 | B1 | 9/2003 | Riley et al. |
| 6,635,575 | B1 | 10/2003 | Xia et al. |
| 6,639,189 | B2 | 10/2003 | Ramanan et al. |
| 6,644,786 | B1 | 11/2003 | Lebens |
| 6,663,610 | B1 * | 12/2003 | Thompson ............ B08B 15/007 604/128 |
| 6,677,251 | B1 | 1/2004 | Lu et al. |
| 6,740,602 | B1 | 5/2004 | Hendriks et al. |
| 6,740,605 | B1 | 5/2004 | Shiraiwa et al. |
| 6,756,085 | B2 | 6/2004 | Waldfried et al. |
| 6,759,098 | B2 | 7/2004 | Han et al. |
| 6,770,866 | B2 | 8/2004 | Retschke et al. |
| 6,797,643 | B2 | 9/2004 | Rocha-Alvarez et al. |
| 6,805,801 | B1 | 10/2004 | Humayun et al. |
| 6,812,043 | B2 | 11/2004 | Bao et al. |

(56) References Cited

U.S. PATENT DOCUMENTS

| | | |
|---|---|---|
| 6,821,906 B2 | 11/2004 | Wada et al. |
| 6,831,284 B2 | 12/2004 | Demos et al. |
| 6,835,417 B2 | 12/2004 | Saenger et al. |
| 6,848,458 B1 | 2/2005 | Shrinivasan et al. |
| 6,856,712 B2 | 2/2005 | Fauver et al. |
| 6,860,965 B1 | 3/2005 | Stevens |
| 6,884,738 B2 | 4/2005 | Asai et al. |
| 6,895,179 B2 | 5/2005 | Kanno et al. |
| 6,899,765 B2 | 5/2005 | Krivts et al. |
| 6,900,413 B2 | 5/2005 | Ratliff et al. |
| 6,921,727 B2 | 7/2005 | Chiang et al. |
| 6,958,301 B2 | 10/2005 | Kim et al. |
| 7,005,390 B2 | 2/2006 | RamachandraRao et al. |
| 7,018,479 B2 | 3/2006 | Goodwin |
| 7,018,918 B2 | 3/2006 | Kloster et al. |
| 7,020,238 B1 | 3/2006 | Kantonen et al. |
| 7,025,831 B1 | 4/2006 | Butterbaugh et al. |
| 7,030,041 B2 | 4/2006 | Li et al. |
| 7,067,819 B2 | 6/2006 | Janik |
| 7,087,497 B2 | 8/2006 | Yuan et al. |
| 7,094,713 B1 | 8/2006 | Niu et al. |
| 7,097,712 B1 | 8/2006 | Yamazaki et al. |
| 7,105,463 B2 | 9/2006 | Kurita et al. |
| 7,132,334 B2 | 11/2006 | Lin |
| 7,138,606 B2 | 11/2006 | Kanno et al. |
| 7,148,155 B1 | 12/2006 | Tarafdar et al. |
| 7,160,813 B1 | 1/2007 | Chen et al. |
| 7,166,531 B1 | 1/2007 | van den Hoek et al. |
| 7,169,256 B2 | 1/2007 | Dhindsa et al. |
| 7,176,144 B1 | 2/2007 | Wang et al. |
| 7,208,389 B1 | 4/2007 | Tipton et al. |
| 7,214,630 B1 | 5/2007 | Varadarajan et al. |
| 7,235,459 B2 | 6/2007 | Sandhu |
| 7,241,707 B2 | 7/2007 | Meagley et al. |
| 7,244,672 B2 | 7/2007 | Nguyen et al. |
| 7,247,582 B2 | 7/2007 | Stern et al. |
| 7,253,125 B1 | 8/2007 | Bandyopadhyay et al. |
| 7,256,111 B2 | 8/2007 | Lopatin et al. |
| 7,264,676 B2 | 9/2007 | Lai et al. |
| 7,265,061 B1 | 9/2007 | Cho et al. |
| 7,301,148 B2 | 11/2007 | Johnson |
| 7,304,302 B1 | 12/2007 | Nunan et al. |
| 7,327,948 B1 | 2/2008 | Shrinivasan et al. |
| 7,332,445 B2 | 2/2008 | Lukas et al. |
| 7,381,659 B2 | 6/2008 | Nguyen et al. |
| 7,390,537 B1 | 6/2008 | Wu et al. |
| 7,394,067 B1 | 7/2008 | Soltz et al. |
| 7,410,355 B2 | 8/2008 | Granneman et al. |
| 7,453,560 B2 | 11/2008 | Miyake |
| 7,481,882 B2 | 1/2009 | Won et al. |
| 7,504,663 B2 | 3/2009 | Yamazaki et al. |
| 7,510,982 B1 | 3/2009 | Draeger et al. |
| 7,611,757 B1 | 11/2009 | Bandyopadhyay et al. |
| 7,622,162 B1 | 11/2009 | van Schravendijk et al. |
| 7,638,780 B2 | 12/2009 | Kilburn et al. |
| 7,642,205 B2 | 1/2010 | Timans |
| 7,665,951 B2 | 2/2010 | Kurita et al. |
| 7,704,894 B1 | 4/2010 | Henri et al. |
| 7,772,527 B2 | 8/2010 | Choi |
| 7,790,243 B2 | 9/2010 | Radhakrishnan et al. |
| 7,790,633 B1 | 9/2010 | Tarafdar et al. |
| 7,845,891 B2 | 12/2010 | Lee et al. |
| 7,851,232 B2 | 12/2010 | van Schravendijk et al. |
| 7,906,174 B1 | 3/2011 | Wu et al. |
| 7,935,940 B1 | 5/2011 | Smargiassi |
| 7,941,039 B1 | 5/2011 | Shrinivasan et al. |
| 7,960,297 B1 | 6/2011 | Rivkin et al. |
| 7,993,937 B2 | 8/2011 | Chen et al. |
| 8,058,181 B1 | 11/2011 | Chen et al. |
| 8,075,789 B1 | 12/2011 | Littau et al. |
| 8,137,465 B1 | 3/2012 | Shrinivasan et al. |
| 8,211,510 B1 | 7/2012 | Varadarajan et al. |
| 8,246,778 B2 | 8/2012 | Lu et al. |
| 8,282,768 B1 | 10/2012 | Smargiassi et al. |
| 8,283,644 B2 | 10/2012 | Smargiassi et al. |
| 8,398,816 B1 | 3/2013 | Gytri et al. |
| 8,454,750 B1 | 6/2013 | Shrinivasan et al. |
| 8,512,818 B1 | 8/2013 | Varadarajan et al. |
| 8,518,210 B2 | 8/2013 | Smargiassi et al. |
| 8,629,068 B1 | 1/2014 | Shrinivasan et al. |
| 8,734,663 B2 | 5/2014 | Smargiassi et al. |
| 9,073,100 B2 | 7/2015 | Gytri et al. |
| 2001/0001501 A1 | 5/2001 | Lee et al. |
| 2001/0014512 A1 | 8/2001 | Lyons et al. |
| 2001/0018267 A1 | 8/2001 | Shinriki et al. |
| 2002/0001973 A1 | 1/2002 | Wu et al. |
| 2002/0016085 A1 | 2/2002 | Huang et al. |
| 2002/0017242 A1 | 2/2002 | Hamaguchi et al. |
| 2002/0034626 A1 | 3/2002 | Liu et al. |
| 2002/0064341 A1 | 5/2002 | Fauver et al. |
| 2002/0106500 A1 | 8/2002 | Albano et al. |
| 2002/0117109 A1 | 8/2002 | Hazelton et al. |
| 2002/0123218 A1 | 9/2002 | Shioya et al. |
| 2002/0123240 A1 | 9/2002 | Gallagher et al. |
| 2002/0134439 A1 | 9/2002 | Kawasaki et al. |
| 2002/0148563 A1 | 10/2002 | Carlson et al. |
| 2002/0162630 A1 | 11/2002 | Satoh et al. |
| 2002/0170484 A1 | 11/2002 | Katamine et al. |
| 2002/0172766 A1 | 11/2002 | Laxman et al. |
| 2002/0195683 A1 | 12/2002 | Kim et al. |
| 2003/0000647 A1 | 1/2003 | Yudovsky et al. |
| 2003/0013280 A1 | 1/2003 | Yamanaka |
| 2003/0015669 A1 | 1/2003 | Janos et al. |
| 2003/0015764 A1 | 1/2003 | Raaijmakers et al. |
| 2003/0064604 A1 | 4/2003 | Umeda |
| 2003/0064607 A1 | 4/2003 | Leu et al. |
| 2003/0068881 A1 | 4/2003 | Xia et al. |
| 2003/0113187 A1 | 6/2003 | Lei et al. |
| 2003/0134038 A1 | 7/2003 | Paranjpe |
| 2003/0150560 A1 | 8/2003 | Kinnard et al. |
| 2003/0157248 A1 | 8/2003 | Watkins et al. |
| 2003/0157267 A1 | 8/2003 | Waldfried et al. |
| 2003/0194493 A1 | 10/2003 | Chang et al. |
| 2003/0199603 A1 | 10/2003 | Walker et al. |
| 2003/0200931 A1 | 10/2003 | Goodwin |
| 2003/0228770 A1 | 12/2003 | Lee et al. |
| 2004/0004247 A1 | 1/2004 | Forbes et al. |
| 2004/0018319 A1 | 1/2004 | Waldfried et al. |
| 2004/0022960 A1 | 2/2004 | Rhee et al. |
| 2004/0023513 A1 | 2/2004 | Aoyama et al. |
| 2004/0025787 A1 | 2/2004 | Selbrede et al. |
| 2004/0029391 A1 | 2/2004 | Kirkpatrick et al. |
| 2004/0033662 A1 | 2/2004 | Lee et al. |
| 2004/0058090 A1 | 3/2004 | Waldfried et al. |
| 2004/0060917 A1 | 4/2004 | Liu et al. |
| 2004/0069410 A1 | 4/2004 | Moghadam et al. |
| 2004/0082163 A1 | 4/2004 | Mori et al. |
| 2004/0096593 A1 | 5/2004 | Lukas et al. |
| 2004/0096672 A1 | 5/2004 | Lukas et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0166240 A1 | 8/2004 | Rhee et al. |
| 2004/0183226 A1 | 9/2004 | Newell et al. |
| 2004/0185679 A1 | 9/2004 | Ott et al. |
| 2004/0187790 A1 | 9/2004 | Bader et al. |
| 2004/0221871 A1 | 11/2004 | Fletcher et al. |
| 2004/0224496 A1 | 11/2004 | Cui et al. |
| 2004/0266214 A1 | 12/2004 | Suguro et al. |
| 2005/0006916 A1 | 1/2005 | Mantz |
| 2005/0016687 A1 | 1/2005 | Shinriki et al. |
| 2005/0025892 A1 | 2/2005 | Satoh et al. |
| 2005/0045616 A1 | 3/2005 | Ishihara |
| 2005/0056369 A1 | 3/2005 | Lai et al. |
| 2005/0064726 A1 | 3/2005 | Reid et al. |
| 2005/0072716 A1 | 4/2005 | Quiles et al. |
| 2005/0085094 A1 | 4/2005 | Yoo |
| 2005/0098553 A1 | 5/2005 | Devine et al. |
| 2005/0112282 A1 | 5/2005 | Gordon et al. |
| 2005/0156285 A1 | 7/2005 | Gates et al. |
| 2005/0161821 A1 | 7/2005 | Lee et al. |
| 2005/0164497 A1 | 7/2005 | Lopatin et al. |
| 2005/0170104 A1 | 8/2005 | Jung et al. |
| 2005/0190248 A1 | 9/2005 | Konno et al. |

(56) References Cited

U.S. PATENT DOCUMENTS

| | | |
|---|---|---|
| 2005/0191803 A1 | 9/2005 | Matsuse et al. |
| 2005/0194619 A1 | 9/2005 | Edelstein et al. |
| 2005/0196929 A1 | 9/2005 | Yuan et al. |
| 2005/0208758 A1 | 9/2005 | Lu et al. |
| 2005/0255712 A1 | 11/2005 | Kato et al. |
| 2005/0258164 A1 | 11/2005 | Hiramatsu et al. |
| 2005/0260357 A1 | 11/2005 | Olsen et al. |
| 2005/0260420 A1 | 11/2005 | Collins et al. |
| 2005/0263719 A1 | 12/2005 | Ohdaira et al. |
| 2005/0264218 A1 | 12/2005 | Dhindsa et al. |
| 2005/0272220 A1 | 12/2005 | Waldfried et al. |
| 2006/0018639 A1 | 1/2006 | Ramamurthy et al. |
| 2006/0021568 A1* | 2/2006 | Matsumoto ........... C23C 16/455 118/62 |
| 2006/0024976 A1 | 2/2006 | Waldfried et al. |
| 2006/0027929 A1 | 2/2006 | Cooney et al. |
| 2006/0063662 A1 | 3/2006 | Hata et al. |
| 2006/0074153 A1 | 4/2006 | Boisseau et al. |
| 2006/0081186 A1 | 4/2006 | Shinriki et al. |
| 2006/0105106 A1 | 5/2006 | Balseanu et al. |
| 2006/0118817 A1 | 6/2006 | Haisma |
| 2006/0145304 A1 | 7/2006 | Boyanov et al. |
| 2006/0216839 A1 | 9/2006 | Shemesh et al. |
| 2006/0220251 A1 | 10/2006 | Kloster et al. |
| 2006/0246672 A1 | 11/2006 | Chen et al. |
| 2006/0260538 A1 | 11/2006 | Ye et al. |
| 2006/0269693 A1 | 11/2006 | Balseanu et al. |
| 2007/0015355 A1 | 1/2007 | Lin et al. |
| 2007/0032024 A1 | 2/2007 | Peidous et al. |
| 2007/0034159 A1 | 2/2007 | Komino et al. |
| 2007/0042581 A1 | 2/2007 | Sano et al. |
| 2007/0054504 A1 | 3/2007 | Chen et al. |
| 2007/0105292 A1 | 5/2007 | Chen et al. |
| 2007/0107845 A1 | 5/2007 | Ishizawa et al. |
| 2007/0132054 A1 | 6/2007 | Arghavani et al. |
| 2007/0134821 A1 | 6/2007 | Thakur et al. |
| 2007/0134907 A1 | 6/2007 | Ikeda et al. |
| 2007/0189961 A1 | 8/2007 | Iacopi et al. |
| 2007/0196011 A1 | 8/2007 | Cox et al. |
| 2007/0205788 A1 | 9/2007 | Natsuhara et al. |
| 2007/0218204 A1 | 9/2007 | Garg et al. |
| 2007/0222081 A1 | 9/2007 | Chen et al. |
| 2007/0224824 A1 | 9/2007 | Chen et al. |
| 2007/0243057 A1 | 10/2007 | Shimada et al. |
| 2007/0245569 A1 | 10/2007 | Yu Chen |
| 2007/0275569 A1 | 11/2007 | Moghadam et al. |
| 2007/0281497 A1 | 12/2007 | Liu et al. |
| 2007/0287240 A1 | 12/2007 | Chen et al. |
| 2008/0009141 A1 | 1/2008 | Dubois et al. |
| 2008/0020591 A1 | 1/2008 | Balseanu et al. |
| 2008/0053615 A1 | 3/2008 | Sago et al. |
| 2008/0132055 A1 | 6/2008 | Nguyen et al. |
| 2008/0199977 A1 | 8/2008 | Weigel et al. |
| 2008/0286697 A1 | 11/2008 | Verhaverbeke et al. |
| 2008/0305600 A1 | 12/2008 | Liao et al. |
| 2009/0017640 A1 | 1/2009 | Huh et al. |
| 2009/0039475 A1 | 2/2009 | Shioya |
| 2009/0059406 A1 | 3/2009 | Powers et al. |
| 2009/0060480 A1 | 3/2009 | Herchen |
| 2009/0277472 A1 | 11/2009 | Rivkin et al. |
| 2010/0055904 A1 | 3/2010 | Chen et al. |
| 2010/0267231 A1 | 10/2010 | van Schravendijk et al. |
| 2010/0270004 A1 | 10/2010 | Landess et al. |
| 2011/0070665 A1 | 3/2011 | Chen et al. |
| 2012/0091097 A1 | 4/2012 | Chen et al. |
| 2012/0161021 A1 | 6/2012 | Smargiassi et al. |
| 2013/0125818 A1 | 5/2013 | Wright et al. |
| 2013/0160946 A1 | 6/2013 | Smargiassi et al. |
| 2013/0284087 A1 | 10/2013 | Gytri et al. |
| 2013/0298940 A1 | 11/2013 | Smargiassi et al. |
| 2014/0080324 A1 | 3/2014 | Shrinivasan et al. |

FOREIGN PATENT DOCUMENTS

| | | |
|---|---|---|
| JP | 11214364 | 8/1999 |
| JP | 2001104776 A | 4/2001 |
| JP | 2007194582 A | 8/2007 |
| JP | 63307740 | 12/2008 |
| JP | 05031735 B2 | 9/2012 |
| JP | 05138658 B2 | 2/2013 |
| KR | 20000043888 A | 7/2000 |
| WO | WO-2006104583 A2 | 10/2006 |
| WO | WO-2006127463 A2 | 11/2006 |

OTHER PUBLICATIONS

Final Office Action for U.S. Appl. No. 12/132,559, United States Patent & Trademark Office, Mailed Jul. 12, 2012, 26 pages.
Non-Final Office Action for U.S. Appl. No. 12/132,559, United States Patent & Trademark Office, Mailed Mar. 22, 2012, 23 pages.
Non-Final Office Action for U.S. Appl. No. 12/132,559, United States Patent & Trademark Office, Mailed Nov. 19, 2010, 18 pages.
Non-Final Office Action for U.S. Appl. No. 12/132,559, United States Patent & Trademark Office, Mailed Jun. 9, 2011, 24 pages.
Notice of Allowance for U.S. Appl. No. 12/132,559, United States Patent & Trademark Office, Mailed Oct. 25, 2012, 9 pages.
U.S. Appl. No. 10/046,926, fined Jan. 24, 2002, Gaynor.
U.S. Appl. No. 10/295,965, filed Nov. 15, 2002, Schulberg et al.
U.S. Appl. No. 10/672,311, filed Sep. 26, 2003, Tipton et al.
U.S. Appl. No. 10/301,013, filed Nov. 21, 2002, Watkins et al.
U.S. Appl. No. 10/972,084, filed Oct. 22, 2004, Varadarajan et al.
U.S. Appl. No. 10/807,680, filed Mar. 23, 2004, Wu et al.
U.S. Appl. No. 10/982,654, filed Nov. 5, 2004, Cho et al.
U.S. Appl. No. 11/146,456, filed Jun. 6, 2005, Draeger et al.
U.S. Appl. No. 11/129,266, filed May 12, 2005, Landess et al.
U.S. Appl. No. 11/369,311, filed Mar. 6, 2006, Kelman et al.
U.S. Appl. No. 11/519,445, filed Nov. 11, 2006, Tarafdar et al.
U.S. Appl. No. 11/546,189, filed Oct. 10, 2006, Doble et al.
U.S. Appl. No. 11/897,838, filed Aug. 31, 2007, Varadarajan et al.
U.S. Appl. No. 11/937,364, filed Nov. 8, 2007, Nordin et al.
U.S. Appl. No. 12/008,149, filed Jan. 8, 2008, Smargiassi.
U.S. Appl. No. 61/050,880, filed May 6, 2008, Rivkin et al.
U.S. Appl. No. 12/001,348, filed Dec. 10, 2007, Bolt.
U.S. Appl. No. 11/561,834, filed Nov. 20, 2006, Kamian et al.
U.S. Appl. No. 11/606,340, filed Nov. 28, 2006, Van den Hoek et al.
U.S. Appl. No. 11/608,056, filed Dec. 7, 2006, Vancouver et al.
U.S. Appl. No. 10/622,409, filed Jan. 11, 2007, Shaviv et al.
U.S. Appl. No. 11/608,185, filed Dec. 7, 2006, Rivkin et al.
U.S. Appl. No. 11/622,423, filed Jan. 11, 2007, Schravendijk.
U.S. Appl. No. 11/656,661, filed Jan. 22, 2007, Cho et al.
U.S. Appl. No. 11/688,695, filed Mar. 20, 2007, Shrinivassan et al.
U.S. Appl. No. 11/696,102, filed Apr. 3, 2007, Schravendijk et al.
U.S. Appl. No. 11/713,581, filed Mar. 30, 2007, Haverkamp et al.
U.S. Appl. No. 11/751,584, filed May 21, 2007, Shrinivasan et al.
U.S. Appl. No. 11/851,310, filed Sep. 6, 2007, Shrinivasan et al.
U.S. Appl. No. 11/899,683, filed Sep. 2007, Jiang et al.
U.S. Appl. No. 11/975,473, filed Oct. 18, 2007, Varadarajan et al.
U.S. Appl. No. 11/977,792, filed Oct. 25, 2007, Haverkamp et al.
U.S. Appl. No. 12/140,196, filed Jun. 16, 2008, Gage et al.
U.S. Appl. No. 12/172,089, filed Jul. 11, 2008, Wu et al.
U.S. Appl. No. 12/210,060, filed Sep. 12, 2008, Haverkamp et al.
U.S. Appl. No. 12/333,239, filed Dec. 11, 2008, Gage et al.
U.S. Appl. No. 61/122,308, filed Dec. 12, 2008, Nieh et al.
U.S. Appl. No. 12/341,943, filed Dec. 22, 2008, van Schravendijk et al.
U.S. Appl. No. 12/369,384, filed Feb. 11, 2009, Draeger et al.
U.S. Appl. No. 12/566,514, filed Sep. 24, 2009, Bandyopadhyay et al.
U.S. Appl. No. 12/646,830, filed Dec. 23, 2009, Varadarajan et al.
U.S. Appl. No. 12/726,263, filed Mar. 17, 2010, van Schravendijk et al.
U.S. Appl. No. 12/840,192, filed Jul. 20, 2010, Tarafdar et al.
U.S. Appl. No. 13/070,306, filed Mar. 23, 2011, Eugene Smargiassi.
U.S. Appl. No. 13/370,579, filed Feb. 10, 2012, Shrinivasan et al.
Arghavani et al., Strain Engineering in Non-Volatile Memories, Reed Business Information, 2007, 6 pages.

(56) References Cited

OTHER PUBLICATIONS

Notice of Allowance and Fee Due mailed May 22, 2006, from U.S. Appl. No. 10/672,311.
Allowed Claims from U.S. Appl. No. 10/672,311, filed Mar. 20, 2006.
Notice of Allowance and Fee Due mailed Apr. 4, 2007, from U.S. Appl. No. 10/825,888.
Allowed Claims from U.S. Appl. No. 10/825,888, filed Mar. 27, 2007.
Notice of Allowance and Fee Due mailed Oct. 20, 2006, from U.S. Appl. No. 10/800,377.
Allowed Claims from U.S. Appl. No. 10/800,377, filed Sep. 13, 2006.
U.S. Office Action mailed Nov. 28, 2007, from U.S. Appl. No. 10/807,680.
R.J. Lewis, Sr., Hawley's Condensed Chemical Dictionary, 12th Edition, Van Nostrad Reinhold Co., New York, 1993 (no month), excerpts pp. 916-918 and 1123-1124.
Notice of Allowance and Fee Due mailed Dec. 20, 2005, from U.S. Appl. No. 10/860,340.
Allowed Claims from U.S. Appl. No. 10/860,340, filed Oct. 17, 2005.
U.S. Office Action mailed Dec. 12, 2007, from U.S. Appl. No. 11/146,456.
U.S. Office Action mailed Jan. 10, 2008, from U.S. Appl. No. 11/622,423.
Bhadri Varadarajan et al., "Development of High Stress SiN Films for Use with Strained Silicon Technologies"; Proc. 68th Symp. on Semiconductors and IC Tech.; Kyoto 2005.
U.S. Office Action mailed Jun. 16, 2008, from U.S. Appl. No. 11/546,189.
U.S. Office Action mailed Oct. 16, 2008, from U.S. Appl. No. 11/546,189.
U.S. Office Action mailed Jul. 18, 2006, from U.S. Appl. No. 11/184,101.
Notice of Allowance and Fee Due mailed Jan. 25, 2007, from U.S. Appl. No. 11/184,101.
Allowed Claims from U.S. Appl. No. 11/184,101, filed Oct. 18, 2006.
U.S. Office Action mailed Apr. 9, 2010, from U.S. Appl. No. 11/937,364.
U.S. Office Action mailed Feb. 20, 2009, from U.S. Appl. No. 11/129,266.
U.S. Office Action mailed Oct. 28, 2009, from U.S. Appl. No. 11/129,266.
U.S. Office Action mailed Apr. 26, 2010, from U.S. Appl. No. 11/608,185.
U.S. Office Action mailed Jun. 8, 2010, from U.S. Appl. No. 11/851,310.
U.S. Office Action mailed Jun. 11, 2010, from U.S. Appl. No. 12/341,943.
International Search Report and Written Opinion for Application No. PCT/US2009/067040, mailed Aug. 2, 2010.
U.S. Office Action mailed Nov. 26, 2010, from U.S. Appl. No. 11/608,185.
U.S. Office Action mailed Dec. 23, 2010, from U.S. Appl. No. 12/341,943.
U.S. Office Action mailed Dec. 27, 2010, from U.S. Appl. No. 12/333,239.
Notice of Allowance for U.S. Appl. No. 11/851,310, mailed Jan. 5, 2011.
Allowed Claims for U.S. Appl. No. 11/851,310, as of mailed Jan. 5, 2011.
U.S. Final Office Action mailed Dec. 27, 2010, from U.S. Appl. No. 11/937,364.
Notice of Allowance mailed Nov. 19, 2010, from U.S. Appl. No. 12/008,149.
U.S. Office Action mailed Jan. 5, 2010, from U.S. Appl. No. 11/369,311.
U.S. Final Office Action mailed Dec. 31, 2009, from U.S. Appl. No. 11/688,695.
U.S. Final Office Action mailed Jan. 25, 2010, from U.S. Appl. No. 11/590,661.
U.S. Office Action mailed Jan. 22, 2010, from U.S. Appl. No. 11/656,661.
U.S. Office Action mailed Feb. 4, 2010, from U.S. Appl. No. 11/731,581.
U.S. Office Action mailed Feb. 8, 2010, from U.S. Appl. No. 11/899,683.
U.S. Office Action mailed Mar. 9, 2010, from U.S. Appl. No. 11/977,792.
Chaabouni, H. et al., "Porous SiOCH Ultra Low-K recovery treatments after direct CMP process", Advanced Metallization Conference, Sep. 2008.
Chaabouni, H. et al, "Sidewall Restoration of Porous Ultra Low-K Dielectrics for Sub-45 NM Technology Nodes", Microelectronic Engineering 84 (2007).
Huang, H. et al., "O2 Plasma Damage and Dielectric Recoveries to Patterned CDO Low-K Dielectrics", Advanced Metallization Conference, Sep. 2008.
U.S. Office Action mailed Mar. 23, 2010, from U.S. Appl. No. 11/608,056.
U.S. Office Action mailed Mar. 25, 2010, from U.S. Appl. No. 11/975,473.
Takagi et al., "High Rate Deposition of a-SiNx:H by VHF PECVD", Mat. Res. Soc. Symp. Proc. vol. 467, 1997, Materials Research Society.
Notice of Allowance mailed Apr. 21, 2010, from U.S. Appl. No. 11/519,445.
Allowed Claims for U.S. Appl. No. 11/519,445, filed Jul. 20, 2010.
U.S. Office Action mailed May 21, 2010, from U.S. Appl. No. 11/561,834.
U.S. Office Action mailed Jul. 23, 2010, from U.S. Appl. No. 11/688,695.
Notice of Allowance mailed Aug. 6, 2010, from U.S. Appl. No. 11/590,661.
Allowed Claims for U.S. Appl. No. 11/590,661, filed Mar. 25, 2012.
U.S. Final Office Action mailed Aug. 24, 2010, from U.S. Appl. No. 11/656,661.
U.S. Office Action mailed Sep. 13, 2010, from U.S. Appl. No. 12/172,089.
Li, Shuang et al., "Organic-Functionalized Pure-Silica-Zeolite MFI Low-K Films", Chem. Matter. 2005, 17 Mar. 9, 2005, pp. 1851-1854.
U.S. Office Action mailed Sep. 2, 2010, from U.S. Appl. No. 11/731,581.
U.S. Office Action mailed Oct. 15, 2010, from U.S. Appl. No. 10/972,084.
U.S. Office Action mailed Oct. 25, 2010, from U.S. Appl. No. 11/977,792.
U.S. Office Action mailed Nov. 1, 2010, from U.S. Appl. No. 11/975,473.
Notice of Allowance mailed Nov. 2, 2010, from U.S. Appl. No. 11/608,056.
Allowed Claims for U.S. Appl. No. 11/608,056, filed Dec. 21, 2009.
U.S. Office Action mailed Jan. 11, 2011, from U.S. Appl. No. 12/566,514.
U.S. Final Office Action mailed Dec. 3, 2010, from U.S. Appl. No. 11/561,834.
U.S. Office Action mailed Jan. 26, 2011, from U.S. Appl. No. 11/696,102.
U.S. Appl. No. 11/688,695, Final Office Action mailed Feb. 1, 2011.
U.S. Office Action mailed Jul. 25, 2008, from U.S. Appl. No. 11/146,456.
Notice of Allowance mailed Nov. 10, 2008, from U.S. Appl. No. 11/146,456.
Notice of Allowance mailed Dec. 15, 2008, from U.S. Appl. No. 11/146,456.
U.S. Office Action mailed Feb. 22, 2011, from U.S. Appl. No. 12/369,384.
U.S. Office Action mailed Feb. 15, 2008, from U.S. Appl. No. 11/602,564.
U.S. Office Action mailed Sep. 4, 2008, from U.S. Appl. No. 11/602,564.
U.S. Office Action mailed Mar. 20, 2009, from U.S. Appl. No. 11/602,564.

(56) References Cited

OTHER PUBLICATIONS

U.S. Office Action mailed Mar. 17, 2010, from U.S. Appl. No. 12/008,149.
U.S. Office Action mailed Apr. 3, 2008, from U.S. Appl. No. 10/982,654.
Notice of Allowance mailed Oct. 8, 2009, from U.S. Appl. No. 11/811,048.
U.S. Office Action mailed Oct. 9, 2009, from U.S. Appl. No. 11/975,473.
U.S. Office Action mailed Nov. 5, 2009, from U.S. Appl. No. 11/622,409.
U.S. Office Action mailed Nov. 4, 2009, from U.S. Appl. No. 11/519,445.
U.S. Office Action mailed Nov. 27, 2009, from U.S. Appl. No. 10/972,084.
U.S. Office Action mailed Dec. 22, 2009, from U.S. Appl. No. 11/696,102.
U.S. Office Action mailed Sep. 19, 2008, from U.S. Appl. No. 11/824,049.
U.S. Final Office Action mailed Jul. 10, 2008, from U.S. Appl. No. 10/807,680.
U.S. Final Office Action mailed Jul. 25, 2008, from U.S. Appl. No. 11/146,456.
U.S. Final Office Action mailed Jul. 9, 2008, from U.S. Appl. No. 10/982,654.
U.S. Office Action mailed May 14, 2008, from U.S. Appl. No. 11/519,445.
U.S. Office Action mailed Jul. 23, 2008, from U.S. Appl. No. 11/622,423.
U.S. Office Action mailed Apr. 6, 2009, from U.S. Appl. No. 11/590,661.
U.S. Office Action mailed Mar. 19, 2009, from U.S. Appl. No. 11/811,048.
Rodriquez, J.A. et al., "Evolution of the Mechanical Stress on PECVD Silicon Oxide Films Under Thermal Processing", Journal of Materials Science Letters 19, 2000, pp. 1399-1401.
U.S. Office Action mailed Feb. 5, 2009, from U.S. Appl. No. 11/606,340.
U.S. Office Action mailed Mar. 19, 2009, from U.S. Appl. No. 11/824,049.
Notice of Allowance mailed Jun. 22, 2009, from U.S. Appl. No. 11/824,049.
Allowed Claims for U.S. Appl. No. 11/824,049, filed Jun. 5, 2009.
U.S. Office Action mailed Dec. 4, 2008, from U.S. Appl. No. 10/982,654.
U.S. Office Action mailed Dec. 10, 2008, from U.S. Appl. No. 11/519,445.
U.S. Office Action mailed Dec. 30, 2008, from U.S. Appl. No. 10/972,084.
U.S. Office Action mailed Jun. 11, 2009, from U.S. Appl. No. 11/688,695.
U.S. Office Action mailed Jul. 1, 2009, from U.S. Appl. No. 11/696,102.
Yu, J.J. et al., "UV Annealing of Ultrathin Tantalum Oxide Films", Applied Surface Science, V 186 (2002), 57-63.
Notice of Allowance mailed Aug. 17, 2009, from U.S. Appl. No. 11/811,048.
Allowed Claims for U.S. Appl. No. 11/811,048, filed Sep. 20, 2009.
U.S. Office Action mailed Aug. 20, 2009, from U.S. Appl. No. 11/369,311.
U.S. Office Action mailed Aug. 20, 2009, from U.S. Appl. No. 11/608,056.
P Morin et al., "Tensile contact etch stop layer for nMOS Performance Enhancement: Influence of the Film Morphology", ECS Meeting, May 2005.
Takagi et al., "High Rate Deposition of a-Si:H and a-SiN.sub.x:H by VHF PECVD", Vacuum, 51, 1998.
Smith, D.L. et al., "Mechanism of $SiN_3$—$SiR_4$ Liasma", J. Electrochem. Soc., vol. 137 (2) 1990.

Nagayoshi et al., "Residual Stress of a $Si_{1-x}N_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.
U.S. Office Action mailed Oct. 28, 2008, from U.S. Appl. No. 11/975,473.
U.S. Office Action mailed Mar. 23, 2009, from U.S. Appl. No. 11/975,473.
U.S. Office Action mailed May 29, 2009, from U.S. Appl. No. 11/899,683.
U.S. Office Action mailed Aug. 26, 2009, from U.S. Appl. No. 11/519,445.
U.S. Office Action mailed Jul. 1, 2009, from U.S. Appl. No. 11/622,409.
U.S. Office Action mailed Jun. 1, 2009, from U.S. Appl. No. 11/731,581.
Cho et al., "Plasma Treatments of Molecularly Templated Nanoporous Silica Films," Electrochemical and Solid State Letters, 4 (4) G35-G38 (2001).
Yung et al., "Spin-On Mesoporous Silica Films with Ultralow Dielectric Constants, Ordered Pore Structures, and Hydrophobic Surfaces," Adv. Mater. 2001, 13, No. 14, 1099-1102.
Jan, C.H., et al., 90NM Generation, 300mm Wafer Low K ILD/Cu Interconnect Technology, 2003 IEEE Interconnect Technology Conference.
Gangpadhyay et al., "The First International Surface Cleaning Workshop," Northeastern University, Nov. 11-14, 2002.
U.S. Office Action mailed Sep. 7, 2004, from U.S. Appl. No. 10/672,311.
U.S. Office Action mailed Dec. 28, 2004, from U.S. Appl. No. 10/672,311.
Peter Singer, "New Materials and Designs to Improve Transistor Performance", Apr. 1, 2004, Semiconductor International.
Ghani et al., "A 90nm High Volume Manufacturing Logic Technology Featuring Novel 45nm Gate Length Strained Silicon CMOS Transistors", IEEE, 2003.
Bhadri N. Varadarajan, "Tensile Silicon Nitride—P1264 NESL", C & F Study, Aug. 21, 2003.
U.S. Office Action mailed Mar. 2, 2005, from U.S. Appl. No. 10/860,340.
U.S. Final Office Action mailed Jun. 13, 2005, from U.S. Appl. No. 10/860,340.
U.S. Final Office Action mailed Jul. 13, 2005, from U.S. Appl. No. 10/672,311.
U.S. Office Action mailed Dec. 20, 2005, from U.S. Appl. No. 10/672,311.
U.S. Office Action mailed Mar. 29, 2006, from U.S. Appl. No. 10/800,377.
U.S. Office Action mailed Jun. 28, 2006, from U.S. Appl. No. 10/825,888.
U.S. Office Action mailed Dec. 27, 2006, from U.S. Appl. No. 10/825,888.
U.S. Appl. No. 11/115,576, Office Action mailed Oct. 3, 2007.
U.S. Appl. No. 11/115,576, Office Action mailed May 2, 2008.
U.S. Appl. No. 11/115,576, Office Action mailed Oct. 17, 2008.
U.S. Appl. No. 11/115,576, Office Action mailed Apr. 22, 2009.
U.S. Appl. No. 11/115,576, Office Action mailed Oct. 1, 2009.
U.S. Appl. No. 11/602,564, "Method of Eliminating Small Bin Defects in High Throughput Teos Films", Henri et al., filed Nov. 20, 2006.
U.S. Appl. No. 11/115,576, Office Action mailed Apr. 15, 2010.
U.S. Appl. No. 11/115,576, Office Action mailed Oct. 1, 2010.
U.S. Appl. No. 11/115,576, Office Action mailed May 9, 2011.
U.S. Appl. No. 12/001,348, Office Action mailed May 20, 2011.
U.S. Appl. No. 11/115,576, Notice of Allowance mailed Nov. 14, 2011.
U.S. Appl. No. 12/001,348, Office Action mailed Nov. 25. 2011.
U.S. Appl. No. 11/688,695, Office Action mailed Dec. 14, 2011.
U.S. Appl. No. 11/115,576, Claims as Allowed dated Aug. 9, 2011.
U.S. Appl. No. 12/726,263, Office Action mailed May 31, 2012.
U.S. Appl. No. 12/001,348, Office Action mailed Mar. 26, 2012.
U.S. Appl. No. 13/070,306, Notice of Allowance mailed Jun. 7, 2012.
U.S. Appl. No. 13/070,306, Allowed Claims as of Jun. 7, 2012.

(56) References Cited

OTHER PUBLICATIONS

U.S. Appl. No. 11/688,695, Final Office Action mailed Jun. 21, 2012.
US. Appl. No. 10/056,926, filed Jan. 24, 2002, Gaynor.
U.S. Appl. No. 11/519,445, filed Sep. 11, 2006, Tarafdar et al.
U.S. Appl. No. 11/606,340, Nov. 28, 2006, Van den Hoek et al.
U.S. Appl. No. 11/622,409, filed Jan. 11, 2007, Shaviv et al.
U.S. Appl. No. 11/731,581, filed Mar. 30, 2007, Haverkamp et al.
Allowed Claims from U.S. Appl. No. 10/800,377, fled Sep. 13, 2006.
Allowed Claims for U.S. Appl. No. 11/519,445, filed Sep. 11, 2006.
Allowed Claims for U.S. Appl. No. 11/590,661, filed Mar. 25, 2010.
U.S. Office Action mailed Feb. 2, 2011, from U.S. Appl. No. 11/688,695.
Allowed Claims for U.S. Appl. No. 11/824,049, filed Jun. 28, 2007.
Allowed Claims for U.S. Appl. No. 11/811,048, filed Jul. 20, 2009.
Smith, D.L. et al., "Mechanism of $SiN_3$-$SiH_4$ Llasma", J. Electrochem. Soc., vol. 137 (2) 1990.

* cited by examiner

PURGING OF POROGEN FROM UV CURE CHAMBER

CROSS-REFERENCE TO RELATED APPLICATIONS

This application is a continuation of U.S. patent application Ser. No. 13/944,421, filed Jul. 17, 2013, which is a continuation of U.S. patent application Ser. No. 13/562,421 (now U.S. Pat. No. 8,518,210), filed Jul. 31, 2012, which is a continuation of U.S. patent application Ser. No. 12/586,175 (now U.S. Pat. No. 8,282,768), filed Sep. 18, 2009, which is a divisional application, claiming priority under 35 USC §§ 120 and 121 and 37 CFR 1.53(b) of co-owned and co-pending U.S. patent application Ser. No. 11/391,134, filed Mar. 28, 2006, by Smargiassi et al., which claims the benefit under 35 USC 119(e) of U.S. Provisional Application Ser. No. 60/742,844, filed Dec. 5, 2005. U.S. patent application Ser. No. 11/391,134 is also a continuation-in-part application, claiming priority under 35 USC 120, of co-owned and co-pending U.S. Pat. No. 8,137,465 issued Mar. 20, 2012, having the title "Single Chamber Sequential Curing of Semiconductor Wafers." These parent applications are incorporated herein by reference for all purposes.

FIELD

The invention is related to the field of integrated circuit fabrication, in particular to methods and apparatuses for purging and cleaning process chambers used in the annealing and curing of semiconductor wafers.

BACKGROUND

There is a general need for materials with low dielectric constants (low-k) in the integrated circuit manufacturing industry. Using low-k materials as the intermetal and/or interlayer dielectric of conductive interconnects reduces the delay in signal propagation due to capacitive effects. The lower the dielectric constant of the dielectric, the lower the capacitance of the dielectric and the lower the RC delay 25 of the IC.

Low k dielectrics are conventionally defined as those materials that have a dielectric constant lower than that of silicon dioxide, that is k<~4. Typical methods of obtaining low-k materials include doping silicon dioxide with various hydrocarbons or fluorine. These doping methods, however, generally cannot 30 produce materials with dielectric constants lower than about 2.6. With more and more advanced technology needs, present efforts are focused on developing low-k dielectric materials with k less than 2.5. These ultra low-k (ULK) dielectrics can be obtained by incorporating air voids within a low-k dielectric, creating a porous dielectric material.

Methods of fabricating porous dielectrics typically involve forming a composite film (sometimes referred to herein as a "precursor film") containing two components: a porogen (typically an organic material such as a polymer) and a structure former or dielectric material (e.g., a silicon containing material). Once the composite film is formed on the substrate, the porogen component is removed, leaving a structurally intact porous dielectric matrix. Techniques for removing porogens from the composite film include, for example, a thermal process in which the substrate is heated to a temperature sufficient for the breakdown and vaporization of the organic porogen. These thermal processes, however, have certain difficulties. In particular, substrate temperatures generally need to be high (i.e., greater than about 400° C.) with exposure times typically on the order of hours. As is well known in the field, these conditions can damage copper containing devices.

Methods have been developed to form a porous low-k or ultra-low-k (ULK) film of dielectric material by first forming a precursor film that contains a porogen and a structure former, or "backbone", on a substrate, and then exposing the precursor film to ultra-violet radiation (UV) in a curing process to remove the porogen. The porogens evolved from low-k and ULK dielectric films in a UV curing chamber during a curing process tend to form porogen deposits on a quartz window through which ultraviolet curing (UVC) light is transmitted into a curing chamber. The resulting porogen deposit on the quartz window inhibits UVC light transmission. As a result, it is generally possible to cure only a few wafers between cleaning the curing chamber and the quartz window.

SUMMARY

The invention helps to solve some of the problems mentioned. Embodiments in accordance with the invention are particularly suitable for purging and cleaning curing chambers used to anneal and to cure interconnect-level dense or porous low-k dielectrics. As a result, it is possible to cure a large number of wafers, for example, 25 or more wafers, before cleaning the quartz window a_nd the curing chamber.

Some embodiments in accordance with the invention provide ultraviolet thermal processing (UVTP) of semiconductor wafers, particularly 300 mm wafers, with purging of at least a portion of the processing space. Embodiments generally provide post-deposition processing of advanced dielectric films and address the semiconductor manufacturing challenges of depositing highly uniform films with low thermal budgets.

Typically, in curing operations in accordance with the invention, a combination of UV light and heat facilitates curing of low-k films at relatively low temperatures. For example, wafers with a previously deposited PECVD (plasma enhanced chemical vapor deposition) film are introduced into a curing chamber in accordance with the invention, where they are exposed to a uniform UV lamp source to modify the film properties. At the same time, the wafer is heated to a uniform temperature, typically 450° C. or less. With porous low-k films, UV radiation facilitates removal of porogens and mechanically strengthens the dielectric film for further processing.

Some embodiments provide independent control of UV light intensity, temperature, and process time on each of a plurality of cure stations.

Generally, embodiments in accordance with the invention provide purging of cure chambers that significantly reduces cleaning requirements during wafer processing compared to the prior art. In some embodiments in accordance with the invention, more than 100 porogen containing wafers are processed before a chamber clean is required, resulting in a throughput that is as much as 20 times higher than the industry average.

A basic embodiment of a purge ring in accordance with the invention includes: an inlet portion; an inlet plenum located in the inlet portion, the inlet plenum being fluidically connectable to a gas source; an inlet baffle located in the inlet portion; an exhaust portion; and an exhaust channel located in the exhaust portion, the exhaust channel being located substantially opposite the inlet baffle. The inlet portion and exhaust portion at least partially define a ring hole space. The inlet baffle is operable to convey gas from the inlet plenum into the ring hole space, and the exhaust portion is operable to convey gas and other matter out of the ring hole space. The ring hole space is generally substantially circular (i.e., cylindrical). The inlet baffle generally surrounds not less than 180° of the periphery of the ring hole space, preferably not less than about 240° of the periphery. In some embodiments, the purge ring hole defined by the purge ring wall has a height in a range of about from 14 mm to 25 mm and an elliptical area in a range of about from 600 cm$^2$ to 800 cm$^2$, and the inlet baffle has an open flow area in a range of about from 4 cm$^2$ to 9 cm$^2$. The corresponding inlet plenum has a cross-sectional area not less than about 2.0 cm$^2$, and the corresponding exhaust channel has an exhaust outlet having a cross-sectional area of about 20 cm$^2$. A basic embodiment of an apparatus in accordance with the invention for removing chemical species (e.g., porogens) from an integrated circuit wafer, includes: a curing chamber; a pedestal located in the curing chamber for holding an integrated circuit wafer; and a purge ring located in the curing chamber proximate to the pedestal. An exemplary curing chamber further comprises: a quartz window; and a UV light source, the UV light source being operable to transmit UV light through the quartz window through the ring hole space toward the wafer pedestal. The purge ring is located between the quartz window and the pedestal. The quartz window, the purge ring and the pedestal at least partially define a purge space, which purge space includes the ring hole space. Some embodiments further include a ring-window gap between a top surface of the purge ring and the quartz window, wherein the purge space includes the ring-window gap. Some embodiments further include a ring-pedestal gap between a bottom surface of the purge ring and the pedestal, wherein the purge space includes the ring-pedestal gap. In some embodiments, the purge space has a purge space height in a range of about from 35 mm to 60 mm. Typically, an apparatus further includes a gas source selected from the group consisting of an inert gas source, an oxygen gas (O$_2$) source, and a radical oxygen (O$^-$) gas source. Generally, the ring hole space and the pedestal (and the quartz window, when present) are substantially coaxial. Typically, an apparatus includes a pump or other means connected with the exhaust channel for drawing gas and other matter through the ring hole space into the exhaust channel.

A basic embodiment of an apparatus for purging and cleaning an integrated circuit processing chamber, includes a purge space; a wafer pedestal; a gas inlet plenum; a gas inlet baffle, the inlet baffle to being operable to convey gas from the inlet plenum into the purge space; and an exhaust channel, the exhaust channel being operable to convey gas out of the purge space. Some embodiments further comprise a container sidewall having an inlet sidewall portion and an exhaust sidewall portion, wherein the gas inlet plenum is located in the inlet sidewall portion and the exhaust channel is located in the outlet sidewall portion. Typically, the purge space comprises an upper buffer zone and a lower buffer zone. In some embodiments, the gas inlet plenum is located in a gas inlet plenum tube. Some embodiments further comprise an exhaust pump connected to the exhaust channel, the exhaust pump being operable to draw gas out of the purge space. Typically, the gas inlet plenum has a length not less than about the diameter of the wafer for which the apparatus is designed.

A basic embodiment of a method in accordance with the invention of purging a processing chamber during processing of an integrated circuit wafer comprises processes of: providing a purge ring in a wafer processing chamber; and flowing a purge gas through the inlet plenum and into the ring hole space of the purge ring. Typically, a method of purging a processing chamber further comprises processes of: providing an integrated circuit wafer proximate to the purge ring so that the integrated circuit wafer at least partially defines a purge space, the purge space including the ring hole space of the purge ring. In some embodiments of a method in accordance with the invention, the processing chamber comprises a solid top element, and the method further includes locating the purge ring between the solid top element and the integrated circuit wafer so that the solid top element at least partially defines the purge space. In some embodiments involving a curing method, the processing chamber comprises a quartz window, and the method further includes locating the purge ring between the quartz window and the integrated circuit wafer so that the quartz window at least partially defines the purge space. Some embodiments further include processes of transmitting UV light through the quartz window toward the integrated circuit wafer. Some embodiments further comprise processes of heating the integrated circuit wafer. Typically, the purge ring and the integrated circuit wafer (and of the quartz window, when present) are positioned so that they are substantially coaxial. In some embodiments, flowing a purge gas comprises flowing a nonreactive gas or an inert gas, such as argon, helium or nitrogen. Preferred embodiments include processes of preheating purge gas before it enters the ring hole space through the inlet plenum.

A basic embodiment of a method of cleaning a processing chamber in accordance with the invention includes processes of: providing a purge ring in a wafer processing chamber, and flowing a cleaning gas through the inlet plenum of the purge ring and into the ring hole space. Typically, the processing chamber contains a wafer pedestal, and a method further includes locating the purge ring proximate to the wafer pedestal so that the wafer pedestal at least partially defines a purge space. In some embodiments, the processing chamber further comprises a solid top element, and the method further includes locating the purge ring between the solid top element and the wafer pedestal so that the solid top element at least partially defines the purge space. In some embodiments, the processing chamber further comprises a quartz window; and the method further includes locating the purge ring between the quartz window and the wafer pedestal so that the quartz window at least partially defines the purge space. Some embodiments further include transmitting UV light through the quartz window toward the wafer pedestal. Some embodiments further include heating the purge ring. Generally, the purge ring and the wafer pedestal are positioned so that the ring hole space and the wafer pedestal (and the quartz window, if present) are substantially coaxial. In some embodiments, flowing a cleaning gas comprises flowing a gas selected from a group comprising radical oxygen gas, O$^-$, molecular oxygen gas, O$_2$, and ozone gas O$_3$.

Other features, characteristics and advantages of embodiments in accordance with the invention will become apparent in the detailed description below.

BRIEF DESCRIPTION OF THE DRAWINGS

A more complete understanding of the invention may be obtained by reference to the drawings, in which.

DETAILED DESCRIPTION

Figure 1:
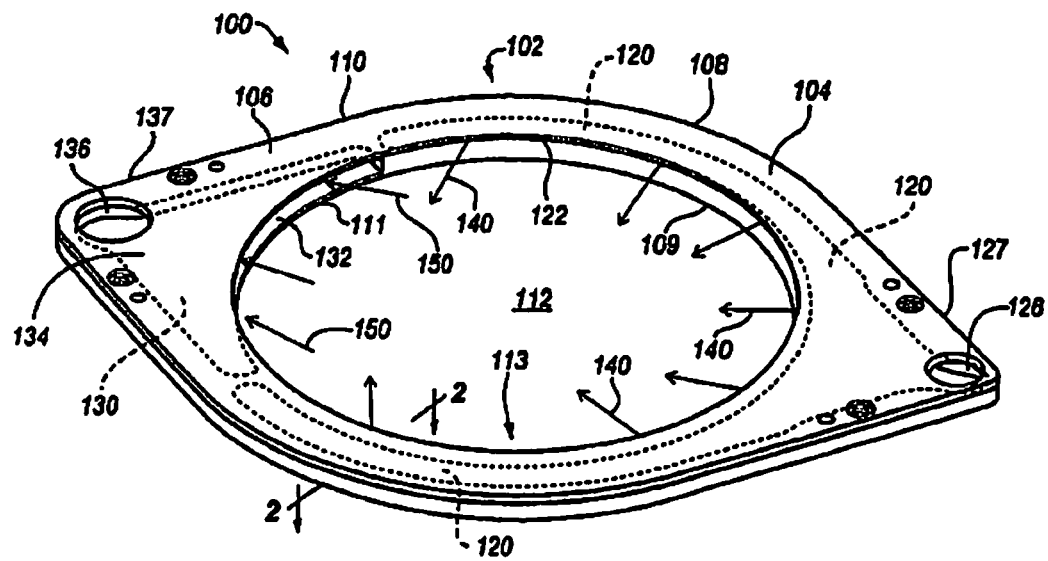
FIG. 1 depicts schematically a perspective view of a purge ring in accordance with the invention having a continuous-slit baffle.

The invention is described herein with reference to FIGS. 1-16. It should be understood that the structures and systems depicted in schematic form in FIGS. 1-9, 12-16 serve explanatory purposes and are not precise depictions of actual structures and systems in accordance with the invention. For example, the depiction of fluid inlet and outlet streams in the figures below is different from hardware in some actual embodiments. Furthermore, the embodiments described herein are exemplary and are not intended to limit the scope of the invention, which is defined in the claims below. Although embodiments in accordance with the invention are described herein with reference to curing low-k and ultra-low-k (ULK) dielectric thin films containing porogens, systems and methods in accordance with the invention are suitable to cure materials besides dielectric materials. Systems and methods in accordance with the invention are also operable to cure dielectric material (e.g., boron phosphate silicon glass) that is prone to out-gassing of organic or inorganic species that are not porogens. In addition, systems and methods generally described herein are also suitable for purging and cleaning processing chambers that are used for treating an integrated circuit wafer by techniques other than wafer curing or annealing. For the sake of clarity, parts and elements of various embodiments having similar structure and function are identified using the same reference numerals in the figures described below.

In this specification, terms of orientation, such as "face-up", "above", "below", "up", "down", "top", "bottom", horizontal and "vertical" used to describe embodiments relate to the relative directions in FIGS. 1, 3, 5-. 8, 12-16 in which the long dimension of a purge ring or an integrated circuit wafer defines a substantially horizontal plane. It is understood, however, that the spatial orientation of substrates, systems and apparatuses in embodiments in accordance with the invention are not confined to those depicted in the drawings.

FIG. 1 depicts schematically a perspective view 100 of a purge ring 102 in accordance with the invention. Purge ring 102 comprises an inlet portion 104 and an exhaust portion 106. Inlet portion 104 comprises inlet ring wall 108 having inlet inner sidewall surface 109. Exhaust portion 106 comprises exhaust ring wall 110 having exhaust inner sidewall surface 111. Purge ring 102 is operable to purge ring hole space 112 defined by inner sidewall surfaces 109, 111 of inlet portion 104 and exhaust portion 106, respectively. Typically, inlet portion 104 and exhaust portion 106 define a circular or elliptical ring hole space 112. Thus, inner sidewall surfaces 109, 111 of inlet portion 104 and exhaust portion 106, respectively, define the periphery 113 of ring hole space 112.

Purge ring 102 further includes inlet plenum 120 located within inlet ring wall 108 (indicated by dashed path in inlet portion 104 in FIG. 1). Purge ring 102 includes inlet baffle 122, which is operable for the flowing of purge gas from plenum 120 into ring hole space 112 during purging. Also, during periodic cleaning operations, cleaning gas, such as O⁻ or $O_2$ (in some embodiments, $O_2$ is converted by UV to ozone) flows through baffle 122 into ring hole space 112 to clean a window surface and other equipment surfaces. Purge ring 102 includes gas inlet hole 126 located in inlet portion 104 at proximal end 127 of purge ring 102. Purge ring 102 further comprises an exhaust channel 130 located in exhaust portion 106 (indicated by dashed path in exhaust portion 106 in FIG. 1). Purge ring 102 includes exhaust channel opening 132 in wall 110 of exhaust portion 106. Exhaust channel opening 132 is operable for conducting gas and other matter (e.g., suspended particulate matter) from ring hole space 112 into exhaust channel 130. Purge ring 102 includes an exhaust channel outlet 134 through which gas and other matter flows into exhaust outlet hole 136, which is located at the distal end 137 of purge ring 102. Typically, an exhaust pump provides suction to draw gas and other matter from ring hole space 112 30 through exhaust channel 130 and exhaust outlet hole 136.

In preferred embodiments in accordance with the invention, inlet baffle 122 comprises a continuous slit in inlet ring wall 108, which slit fluidically connects the inlet side (e.g., inlet plenum 120) to ring hole space 112, as depicted in FIG. 1. In some embodiments, an inlet baffle comprises a plurality of slots or holes in inlet ring wall 108 that fluidically connect an inlet plenum with a ring hole space. Inlet flow arrows 140 in FIG. 1 represent a flow of gas from inlet plenum 120 through baffle 122 into ring hole space 112. Exhaust flow arrows 150 in FIG. 1 represent the flow of gas and, in some circumstances, particulate matter out of ring hole space 112 into exhaust channel 130. As depicted in FIG. 1, plenum 120, inner sidewall surface 109 of inlet portion 104, and baffle 122 encompass about 270° of the periphery 113 of circular ring hole space 112. As a result, purge ring 102 is operable for flowing gas through baffle 122 into ring hole space 112 around approximately 270° of periphery 113. Generally, when inlet baffle 122 is operable for flowing gas into ring hole space 112 around a peripheral arc of inlet inner sidewall surface 109 that exceeds 180°, then undesired recirculation of gas and porogens in ring hole space 112 is inhibited. Similarly, undesired flow of gas above or below ring hole space 112 defined by purge ring 102 is inhibited.

Typically, in a purge ring designed for operation with a 300 mm integrated circuit wafer, the purge ring hole (and the inner ring wall defining the hole) has a height in a range of about from 14 mm to 25 mm. Typically, the purge ring hole and the corresponding ring hole space have an elliptical area in a range of about from 600 cm$^2$ to 800 cm$^2$. Typically, in a purge ring designed for operation with a 300 mm integrated circuit wafer, the inlet baffle has an open area in a range of about from 4 cm$^2$ to 9 cm$^2$. The term "open area" here refers to the total cross-sectional area of a continuous-slit baffle at its narrowest sections that is open to gas flow between the plenum and the ring hole space. Typically, the corresponding inlet plenum has a cross-sectional area not less than about 2.0 cm$^2$. A corresponding exemplary exhaust channel has an exhaust channel opening 132 having a cross-sectional area of about 27 cm$^2$, and an exhaust channel outlet having a cross-sectional area of about 20 cm$^2$.

Figure 2:
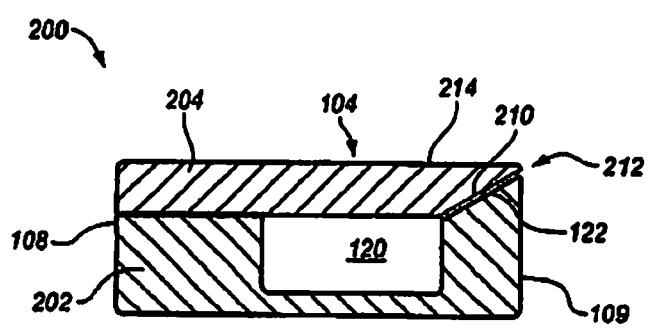
FIG. 2 depicts schematically a cross-sectional view of the inlet ring wall of the inlet portion of the purge ring shown in FIG. 1.

FIG. 2 depicts schematically a cross-sectional view 200 of inlet ring wall 108 of inlet portion 104 of purge ring 102 (FIG. 1). As depicted in FIG. 2, inlet ring wall 108 includes a lower part 202 and an upper part 204. Inlet ring wall includes inlet plenum 120 and inlet baffle 122. Inlet baffle 122 is operable for the flowing of gas from inlet plenum 120 through inlet ring wall 108. In some embodiments, as depicted in FIG. 2, the continuous slit 210 of baffle 122 slants upward at an angle from plenum 120. In an exemplary embodiment, slit 21 0 of baffle 122 has an exit point 212 at inner sidewall surface 109 located about 1 mm down from the top surface 214 of upper part 204. As stated above, the cross-sectional area of inlet plenum 120 as depicted in FIG. 2 has an exemplary value not less than about 2.0 cm$^2$.

Figure 3:
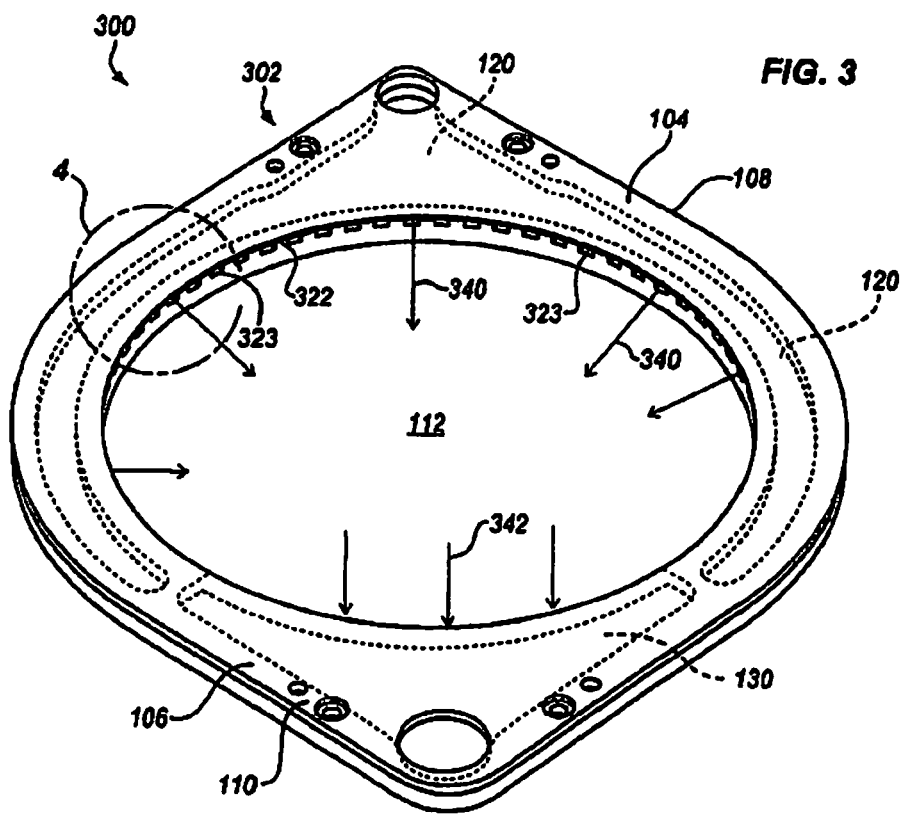
FIG. 3 depicts a perspective view of an alternate design of a purge ring in accordance with the invention having a plurality of baffle slots.

FIG. 3 depicts perspective view 300 of a purge ring 302 in accordance with the invention. Purge ring 302 includes an inlet portion 104 and an exhaust portion 106. Inlet portion 104 includes inlet ring wall 108. Exhaust portion 106 includes exhaust ring wall 110. Inlet portion 104 includes inlet plenum 120 located within inlet ring wall 108. Inlet portion 104 further includes inlet baffle 322 comprising a plurality of baffle slots 323. During operation in accordance with the invention, gas flows from inlet plenum 120 through inlet baffle 322 via baffle slots 323 into ring hole space 112. Exhaust portion 106 includes exhaust channel 130 located in exhaust ring wall 110. During operation, gas and suspended matter flow from ring hole space 112 into exhaust channel 130. In FIG. 3, gas flow arrows 340 indicate the flow of gas from inlet plenum 120 through baffle 322 into ring hole space 112, and flow arrows 342 indicate the flow of gas and particulate matter from ring hole space 112 into exhaust channel 130.

Figure 4:
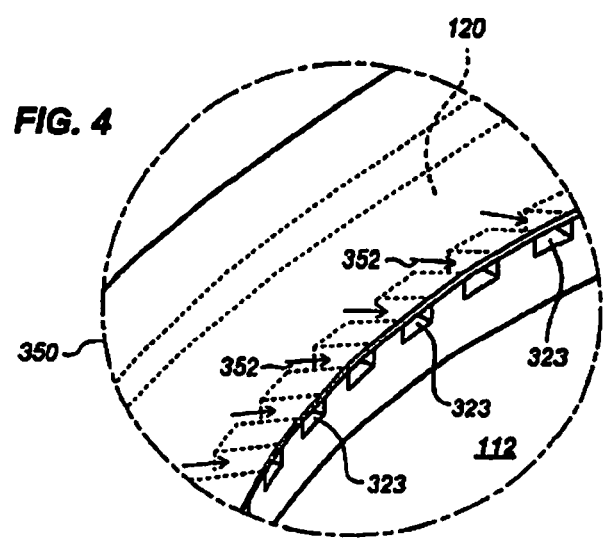
FIG. 4 depicts schematically an enlarged perspective view of a partial view of the inlet ring wall of the inlet portion of the purge ring of FIG. 3 having a plurality of baffle slots.

FIG. 4 depicts schematically an enlarged perspective view 350 of a partial view of inlet ring wall 108 of inlet portion 104 of purge ring 302 (FIG. 3). FIG. 4 depicts a plurality of baffle slots 323 through which gas flows (indicated by flow arrows 352) from plenum 120 into ring hole space 112 during purging or cleaning in accordance with the invention.

EXAMPLE 1

Figure 5:
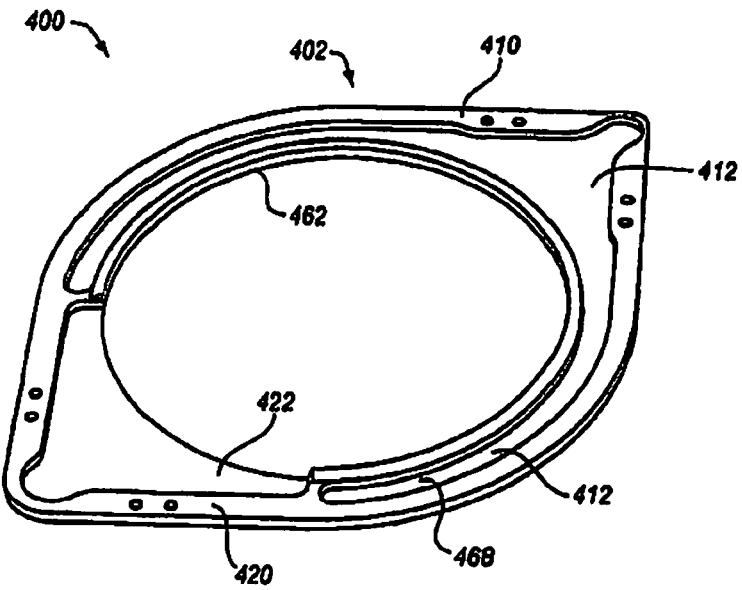
FIG. 5 depicts a perspective view of a lower part of a purge ring in accordance with the invention before assembly with a corresponding upper part.
Figure 6:
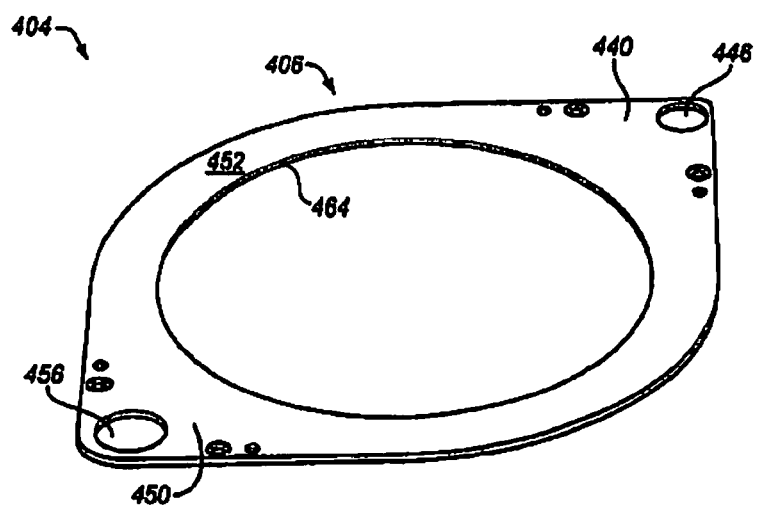
FIG. 6 depicts a perspective view of an upper part for assembling together with the lower part depicted in FIG. 5 to make a purge ring in accordance with the invention.

FIG. 5 depicts a perspective view 400 of lower part 402 of a purge ring in accordance with the invention before assembly with an upper part. FIG. 6 depicts a perspective view 404 of an upper part 406 for assembling together with a lower part 402 (FIG. 5) to make a purge ring in accordance with the invention. As depicted in 30 FIG. 5, lower part 402 comprises an inlet portion 410. Inlet portion 410 includes a recessed region 412 that serves to form an inlet plenum in a purge ring when lower part 402 is assembled together with a corresponding upper part 406. Lower part 402 further includes an exhaust portion 420. Exhaust portion 420 includes a recessed region 422 that serves to form an exhaust channel in a purge ring when lower part 402 is assembled together with a corresponding upper part 406. As depicted in FIG. 6, upper part 406 includes an inlet portion 440 and an exhaust portion 450 that mate together with inlet portion 410 and exhaust portion 420, respectively, of lower part 402 (FIG. 5). Upper part 406 includes gas inlet hole 446, which provides an inlet for gas into an inlet plenum in accordance with the invention. Upper part 406 further includes gas exhaust hole 456, which provides an outlet for gas and suspended matter from an exhaust channel in accordance with the invention.

In an exemplary embodiment of a purge ring in accordance with the invention designed for processing a 300 mm integrated circuit wafer, lower circular wall 462 of lower part 402 and upper circular wall 464 of upper part 406 define a ring hole space having a circular diameter of about 14.4 inches. In an exemplary embodiment, the narrow portion 468 of recessed region 412 of lower part 402 has a radial width of about 0.875 inches. Gas inlet hole 446 has a diameter of about 2.5 em, and gas exhaust hole 456 has a diameter of about 5 em. When assembled together, lower part 402 and upper part 406 form a continuous baffle slit (e.g., baffle 122 of FIG. 2) having a vertical width of about 0.76 mm and a length of about 1.2 em through an inlet ring wall into a ring hole space 112. Recessed region 412 (FIG. 5) extends about 270° around the periphery of circular wall 464. In an exemplary embodiment, the exit location of the continuous slit of baffle 122 from which gas flows into a ring hole space 112 is located about 1' mm down from the top surface 452 of upper part 406.

Figure 7:
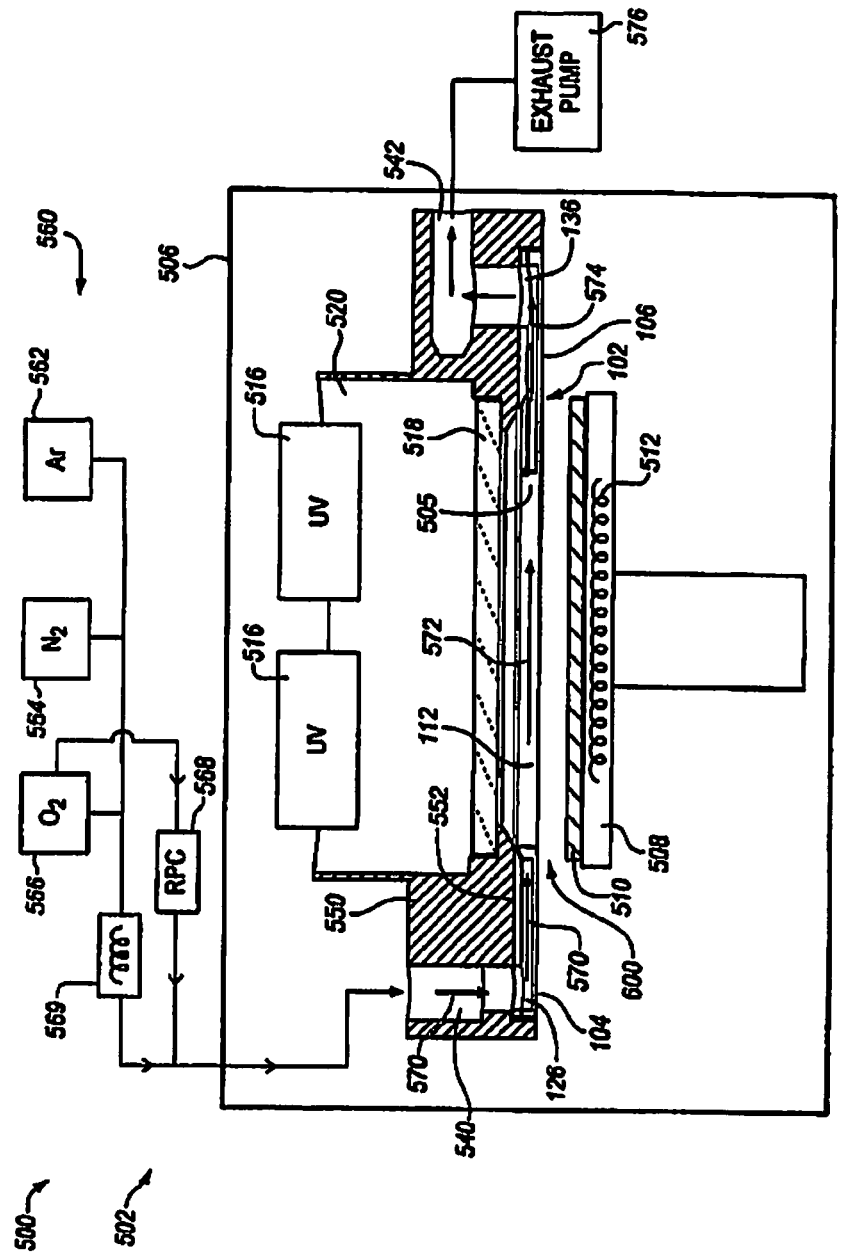
FIG. 7 depicts schematically a cross-sectional view of a curing station having a purge ring that is operable to conduct purging and cleaning in accordance with the invention.

FIG. 7 depicts schematically a cross-sectional view 500 of a curing station 502 having a purge ring 102 that is operable to conduct purging and cleaning in accordance with the invention. Purge ring 102 comprises a purge ring wall 505. Curing station 502 includes a curing chamber 506 that contains a pedestal 508 that is operable to hold a semiconductor wafer 510. Preferred embodiments include a pedestal heater 512 that is operable to heat a wafer 510 and also to heat other components of curing station 502, such as purge ring 102. Curing station 502 further comprises two UV lamps 516 for providing UV light and heat for curing an integrated circuit wafer 510 located on pedestal 508. Curing station 502 also includes a quartz window 518. Purge ring 102 is located between quartz window 518 and pedestal 508. UV lamps 516 and quartz window 518 are located in lamp assembly 520. As depicted in FIG. 7, lamp assembly 520 includes two UV sources 516. It is understood that some curing stations in accordance with the invention have only one UV source and other embodiments include three or more UV sources in a curing station.

A variety of UV light sources are suitable to provide UV light for curing a thin film of material on a semiconductor wafer. Suitable UV light sources include, among others, a Hg linear arc lamp, a microwave-driven Hg lamp, a pulsed xenon lamp, and an Excimer lamp. In some embodiments, the spectral distribution of a UV source is selectively tuned to match the chemical bond absorption in the dielectric films.

Purge ring 102 includes an inlet portion 104 and an exhaust portion 106. Purge ring 102 also includes a gas inlet hole 126 located in inlet portion 104 and a gas exhaust hole 136 located in exhaust portion 106.

Curing station 502 includes gas inlet conduit 540 fluidically connected to gas inlet hole 126, and gas exhaust conduit 542 fluidically connected to gas exhaust hole 136. Curing station 502 further comprises top plate 550. Top plate 550 is configured to support and spatially to orient purge ring 102 and lamp assembly 520, including quartz window 518. For example, in some embodiments, purge ring 102 is bolted to a bottom surface 552 of top plate 550. In some embodiments, as depicted in FIG. 7, gas inlet conduit 540 and exhaust conduit 542 are integral with top plate 550.

Typically, curing station 502 is fluidically connected to one or more gas sources 560 that provide gas through inlet conduit 540 to purge ring 102. As depicted in FIG. 7, gas sources 560 include an argon gas source 562, a nitrogen gas source 564, an oxygen gas source 566, and a remote plasma cleaning unit 568 for providing radical oxygen gas, O$^-$, to curing station 502. In some embodiments of a curing station in accordance with the invention, purge gas and cleaning gas is preheated before entering the inlet portion of a purge ring. FIG. 7 depicts an in-line heater 569 that is operable to preheat purge gas or cleaning gas in accordance with the invention.

During purging or cleaning in accordance with the invention, gas flows from one or more gas sources 560 through gas inlet conduit 540 into the inlet plenum 120 (FIG. 1) of inlet portion 104, as indicated by gas flow arrow 570. The gas then passes from the plenum through baffle 122 (FIG. 1) into ring hole space 112 of purge ring 102, and then flows through ring hole space 112 encompassed by purge ring wall 505, as indicated by gas flow arrow 572. From ring hole space 112, the gas and any suspended matter enters exhaust channel 130 (FIG. 1) in exhaust portion 106, as indicated by flow arrow 57 4, and then exits the curing station through exhaust conduit 542. An exhaust pump 576 is operable to draw gas from ring hole space 112 through exhaust channel 130, exhaust hole 136 and exhaust conduit 542.

Figure 8:
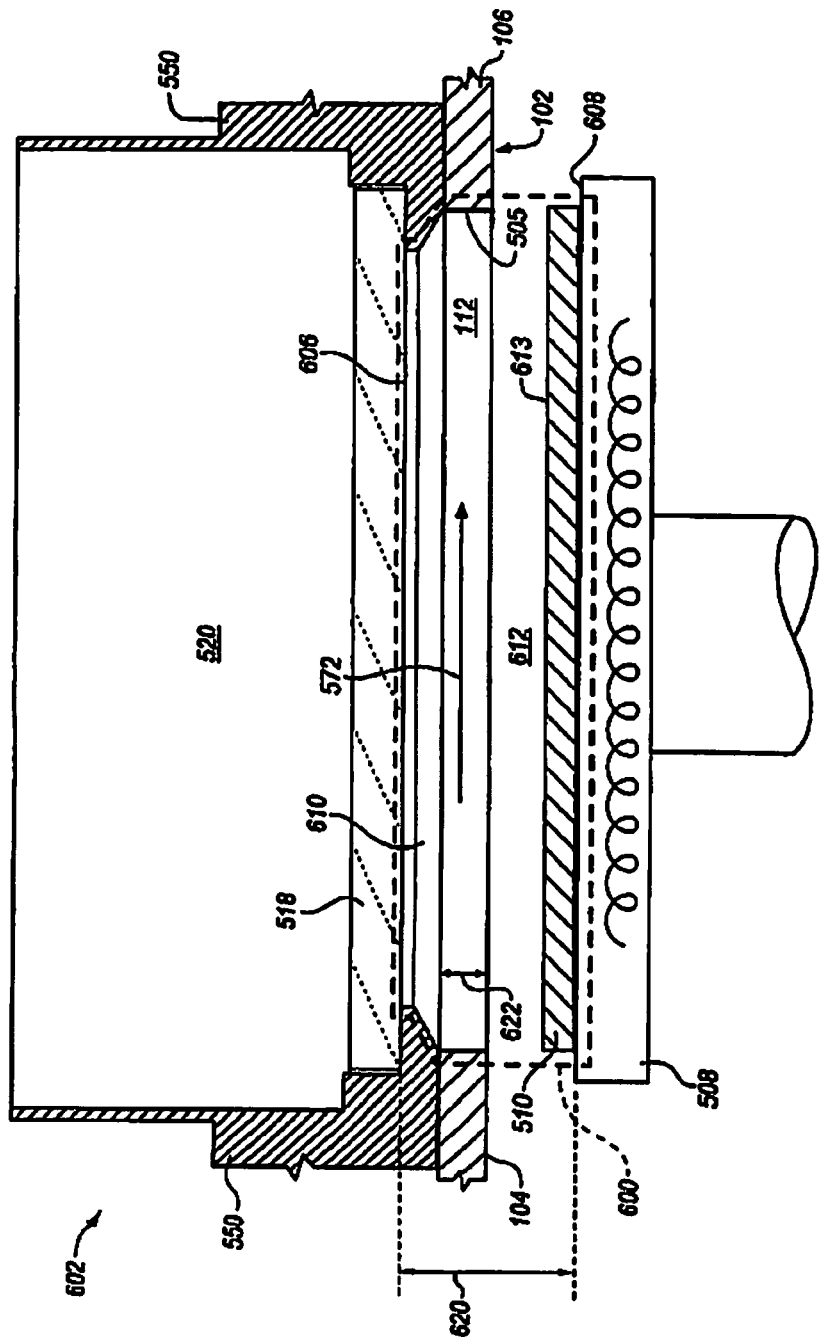
FIG. 8 depicts schematically an enlarged cross-sectional view of the purge space of the curing station shown in FIG. 7.

Several components of a curing station 502 in accordance with the invention together define a purge space 600. Purge space 600 of FIG. 7 is depicted in the enlarged cross-sectional view 602 of FIG. 8. In FIG. 8, purge space 600 includes roughly the empty regions in the curing station between the bottom surface 606 of quartz window 518 and the top surface 608 of pedestal 508. Generally, as depicted in FIGS. 7 and 8, quartz window 518, ring hole space 112 of purge ring 102, and pedestal 508 are substantially coaxial. Above purge ring 102, purge space 600 is bounded on its radial periphery by top plate 550. Essentially, purge space 600 includes: ring hole space 112 encompassed by purge ring wall 505; ring-window gap 610 between purge ring 102 and the bottom surface 606 of quartz window 518; and, ring-pedestal gap 612 between purge ring 102 and the top surface 608 of pedestal 508 (or the top surface 613 of wafer 510, when present). Thus, the purge space height in a curing station comprises the distance between window bottom 606 of quartz window 518 and top surface 608 of pedestal 508, indicated by double arrow 620 in FIG. 8. Typically, the purge space height is in a range of about from 35 mm to 60 mm. Ring-window gap 610 generally comprises a distance in a range of about from zero to 1 cm. Ring-pedestal gap 612 generally comprises a distance in a range of about from zero to 1 cm. In some embodiments, ring-window gap 610 or ring-pedestal gap 612 or both are substantially zero and ring hole space 112 encompassed by purge ring wall 505 includes substantially all of purge space 600. Generally, however, both ring-window gap 610 and ring-pedestal gap 612 comprise a significant finite thickness. In an exemplary embodiment of the invention, represented in FIG. 8: purge space height 620 is approximately 51 mm; the height of purge ring wall 505, which encompasses the ring hole space and is indicated by double arrows 622, is 19 mm; ring-pedestal gap 612 has a gap thickness of 19 mm; and ring-window gap 610 has a gap thickness of about 13 mm. Generally, the distance between quartz window bottom 606 and the baffle of a purge ring (e.g., baffle slit exit 212 in FIG. 2) is in a range of about from 6.3 mm to 19.1 mm, preferably about 13 mm. Generally, a cylindrical ring hole space and a circular integrated circuit wafer are positioned coaxially and have substantially the same diameter. As a result, chemical species emanating from the substrate wafer tend to rise upwards into the ring hole space.

A curing station in accordance with the invention is particularly useful for curing a dielectric film (deposited on a wafer) containing porogens or other volatile species. Techniques for forming low-k and ULK dielectric thin films are known in the art. An exemplary porogen-containing dielectric film is formed by co-depositing the porogen with so-called "backbone" materials. A preferred class of porogens includes polyfunctional cyclic non-aromatic compounds. Typical "backbone" precursor compounds include silane, alkylsilanes, alkoxysilanes, and siloxanes. Co-owned and co-pending U.S. patent application Ser. No. 10/672,311, filed Sep. 26, 2003, having the title "Method of Porogen Removal from Porous Low-k Films Using UV Radiation.", which is hereby incorporated by reference, teaches systems and methods of depositing porogen-containing thin films and curing the thin films using UV radiation to form low-k dielectric material.

In some embodiments, a curing apparatus in accordance with the invention comprises a multistation single chamber tool in which a plurality of UV curing stations are located in a single curing chamber. Co-owned and co-pending U.S. patent application Ser. No. 11/115,576 filed Apr. 26, 2005, having the title "Single Chamber Sequential Curing of Semiconductor Wafers", which is incorporated by reference, teaches an apparatus that is suitable to be modified for conducting curing with purging in accordance with the invention. Typically, a purge ring in accordance with the invention is included at each curing station. At a curing station at which a relatively large amount of porogens is expected to evolve during curing, the material of composition of a purge ring preferably comprises substantially quartz. In some embodiments, at a curing station at which a relatively small amount of porogens is expected to evolve, material from which a purge ring is constructed comprises less expensive material than quartz, for example, aluminum. Compared to aluminum, quartz has an advantage of retaining more heat. Typically, heat suspends porogens, thereby minimizing deposition of porogens on a quartz window, on a purge ring surface, and on other surfaces of a curing apparatus. Typically, a substantial portion of the total amount of porogens in a dielectric film evolve at the initial curing station in a multistation tool.

Figure 9:
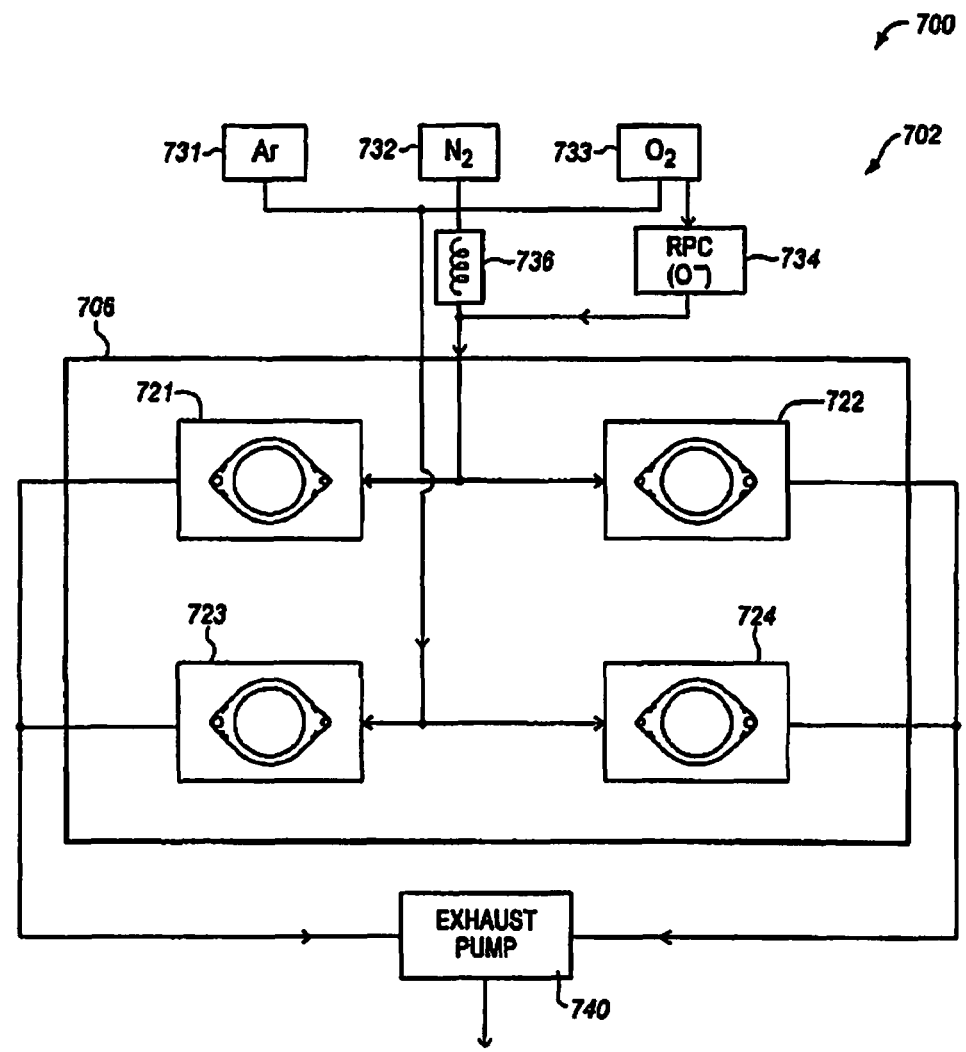
FIG. 9 depicts schematically a plan view of an exemplary curing tool comprising four curing stations in accordance with the invention.

FIG. 9 depicts schematically a plan view 700 of an exemplary curing tool 702 comprising four curing stations in a curing chamber 706. At the first two stations, stations 721 and 722, the purge ring is made substantially from quartz. At stations 723 and 724, the purge ring is made substantially from aluminum. Curing tool 702 further comprises argon gas source 731, nitrogen gas source 732, and oxygen gas source 733. Curing tool 702 also includes a remote plasma cleaning unit 734, which is operable for converting molecular oxygen, $O_2$, to radical oxygen, $O^-$.

In an exemplary method in accordance with the invention, purge gas flowing through a purge ring in accordance with the invention typically comprises an inert gas. Suitable inert gases generally include clean dry air (CDA), $N_2$, carbon dioxide, and the noble gases. Exemplary inert gases are argon and helium. During curing operations, the pressure in a curing chamber typically is maintained at a pressure in a range of about from 5 Torr to 100 Torr, and at a temperature in a range of about from 70° to 500° C. The flow rate of purge gas through a purge ring at a curing station during curing operations is typically in a range of about from 5 standard liters per minute (slm) to 50 slm. In some embodiments, purge gas is preheated before entering the inlet portion of a purge ring, typically to a temperature in a range of about from 160° C. to 225° C. Curing tool 702 includes in-line heater 736 that is operable to preheat purge gas or cleaning gas from gas sources 731, 732, 733 before the gas enters curing stations 721 and 722. An exemplary in-line heater that is operable to preheat purge gas or cleaning gas in accordance with the invention is a model "Starflow" circulation heater, commercially available from Watlow, St. Louis, Mo. Generally, heating of a semiconductor wafer and the curing chamber is provided by a combination of heat from one or several of: one or more heated pedestals; one or more UV curing lamps; and preheated purge gas. Typically, curing of a dielectric film and concurrent purging in accordance with the invention is conducted for a total time period in a range of about from 3 minutes to 30 minutes. In a multistation sequential curing system, the curing time at each curing station is typically the same as at other curing stations. Generally, curing of a dielectric thin-film is conducted in an oxygen-free curing chamber.

Typically, a purge ring in accordance with the invention is also operable to distribute a cleaning gas, such as radical oxygen atoms, $O^-$, for cleaning surfaces of the quartz window, the purge ring (quartz or other material) and other surfaces. Typically, during cleaning operations with radical oxygen, the curing chamber is maintained at a pressure in a range of about from 0.5 Torr to 5 Torr. In some embodiments, radical oxygen is produced by flowing oxygen gas, $O_2$, through a remote plasma cleaning unit 734. An exemplary remote plasma cleaning unit is a model HF-s Astron, commercially available from MKS. Typically, a small amount of nitrogen gas is added to radical oxygen cleaning gas because the nitrogen helps to maintain the oxygen atoms in a radical state. As indicated in FIG. 9, cleaning gas containing radical oxygen typically is not preheated. The flow rate of radical oxygen cleaning gas is typically in a range of about from 5 slm to 15 slm per curing station. For example, oxygen at a flow rate of 8 slm flowing from a remote plasma cleaning unit is combined with 0.5 slm $N_2$. Cleaning with radical oxygen typically is conducted for time period in a range of about from 1 minute to 10 minutes. In a multistation sequential curing apparatus, evolution of porogens and undesired deposition of porogens on apparatus surfaces typically occurs substantially at initial curing stations, and less at subsequent curing stations. As a result, periodic cleaning of the apparatus with radical oxygen generally is conducted at initial curing stations, and not at subsequent curing stations. In some embodiments, after cleaning with specialized cleaning gas, such as radical oxygen, the curing chamber and curing stations are cleaned with ozone gas, which also contributes to cleaning and removal of porogens from apparatus surfaces. In some embodiments, some or all of the cleaning operations are conducted mainly or only using ozone, without using radical oxygen. To clean an apparatus using ozone, typically oxygen gas, $O_2$, is flowed into the inlets of purge rings at a flowrate in a range of about from 4 slm to 8 slm for a time period in a range of about from five minutes to 40 minutes while the pressure is maintained in a range of about from 200 Torr to 800 Torr. The $O_2$ gas is converted to ozone by turning on the UV lamps to provide UV energy.

System 702 further includes an exhaust pump 740 that is operable to draw gas and other matter through the exhaust conduits (e.g., exhaust conduit 542 in FIG. 7) of curing stations 721, 722, 723, 724 during purging and cleaning operations in accordance with the invention.

In some embodiments, a purge ring and a wafer processing apparatus in accordance with the invention designed for processing a 300 mm wafer are operable to process a 200 mm wafer by providing a wafer pedestal and wafer handling devices operable to carry and hold a 200 mm wafer. In other words, in some embodiments, a purge ring and a curing station or other wafer processing station operable for processing a 300 mm wafer are also operable to process a 200 mm wafer without modification of the purge ring and some other station components.

In this specification, the word "space" refers generally to a three-dimensional region in a processing chamber, which space does not include a solid structure. It is clear that in some contexts, a solid structure may be present at the boundaries or within the boundaries of a space, but the term "space" generally does not include a solid structure in such a context.

The term "purge ring" in this specification generally refers to a structure as depicted in FIGS. 1 and 3, which contains a circular ring hole space that has a circular periphery defined by an inner ring-shaped wall. A purge ring in accordance with the invention typically comprises an inlet plenum and a baffle for flowing gas into the ring hole space and an exhaust channel, through which gas and particulate matter flow out of the ring hole space. It is understood, however, that a purge ring in accordance with the invention is not limited to a structure having a circular or cylindrical ring hole space or having a ring-shaped inner wall defining a ring hole space. For example, purge rings in accordance with the invention include structures having non-circular ring-hole spaces, such as elliptical and various polygon-shaped ring-hole spaces. A purge ring is operable for the flowing of a gas, generally a purge gas or a cleaning gas, from an inlet, or proximal, end of a ring hole space, through the ring hole space, and then through the exhaust channel at the opposite, or distal, end of the ring hole space. Preferably, a purge ring is operable so that gas flows from the inlet end to the exhaust end of the ring hole space without recirculation of the gas back towards the inlet end.

The term "purge space" in the specification refers generally to a space in a substrate processing chamber that includes at least the ring hole space, but usually also a space above or below the ring hole space, or both, that is contiguous to the ring hole space. For example, purge space 600 depicted in FIG. 8 includes ring-window gap 610, the ring hole space of purge ring 102, and ring-pedestal gap 612. A purge space in accordance with the invention is characterized in that at least a portion of the purge space is flushed by flowing gas (e.g., purge gas or cleaning gas) during operation. Typically, however, during purging of a system during wafer treatment (e.g., during curing of a ULK film to remove porogens), at least a portion of a purge space is not flushed by flowing gas. For example, in a purging method in accordance with the invention conducted in a system 502, as depicted in FIGS. 7 and 8, a purge ring 102 is designed and operating variables (e.g., pressure, gas flow rates) are selected to minimize gas flow in ring-window gap 610 and ring-pedestal gap 612 and to confine the flow of gas to the ring hole space. As a result, as volatile porogens are released from the integrated circuit wafer 510, they rise upwards through ring-pedestal gap 612 into the ring hole space of purge ring 102 and are flushed by flowing purge gas into the exhaust channel of exhaust portion 106 and out of processing chamber 506. The thickness of ring-pedestal gap 612 is selected to enhance the movement of porogens from wafer 510 into ring hole space 112. The thickness of ring-window gap 610 is selected to provide a barrier to diffusion of porogens from ring hole space 112 of purge ring 102 upwards to quartz window 518. Minimizing diffusion of porogens to quartz window 518 increases the number of wafers that can be cured sequentially before interrupting operations to clean quartz window 518 and the rest of the curing station. As mentioned above, in some embodiments, ring-window gap 610 has a thickness of zero or close to zero (e.g., 1 mm); in other words, there is substantially no space between the bottom of the quartz window and the top of the purge ring. In these embodiments, however, the purge ring height and the location of the inlet baffle exit (e.g., baffle exit 2.12 of FIG. 2) at the inner purge ring wall 109 are designed to provide sufficient barrier distance between the quartz window and the inlet baffle of the purge ring. Preferably, substantially all of the purge gas flows from an inlet baffle through a ring hole space into an exit channel of the purge ring in a substantially horizontal planar region having a finite thickness (e.g., 3-6 mm) without significant recirculation above and below the planar region. It is believed that the suction provided by an exhaust pump through an exhaust channel (e.g., exhaust channel 130) of a purge ring helps to direct and maintain the flow of purge gas from an inlet baffle (e.g., inlet baffle 122) in a substantially planar region in a ring hole space between the inlet baffle and the exhaust channel of the purge ring.

It is important that there be sufficient distance between the bottom of a quartz window and the baffle inlet to provide a sufficient barrier to diffusion of porogens from the planar region of purge gas flow to the quartz window. Generally, regardless of the thickness of the ring-window gap, a window-baffle distance between the bottom of a quartz window and a baffle in a range of about from 6.3 mm to 19.1 mm provides a sufficient barrier to diffusion of porogens to the quartz window. It is clear from the discussion above, that typically only a portion of the total volume of a purge space is flushed with purge gas during purging of a process chamber during wafer treatment. Preferably, only a relatively thin, horizontal slice located in the ring hole space of a purge ring is flushed with flowing purge gas.

In this specification, the term "purge space" also refers to a region in which cleaning of an apparatus is conducted between or after wafer processing operations. During cleaning operations with a cleaning gas, process variables (e.g., pressure and gas flow rates) are selected to enhance the flow of cleaning gas across surfaces to be cleaned (e.g., surfaces of the quartz window, the purge ring, and the wafer pedestal), while minimizing undesired recirculation of material back to the surfaces. It is understood that in some embodiments, the desired flow of cleaning gas through a purge space during cleaning operations is different from the desired flow of purge gas during purging operations.

The term "purge space" has been described with reference to purge space 600, as depicted in FIG. 8, contained in a UV curing chamber. It is understood that systems and methods including a purge ring in accordance with the invention are useful for purging and cleaning an integrated circuit processing chamber that is not a UV curing chamber. In such embodiments that do not include a quartz window, a purge space is defined at least partially by another solid structure instead of the quartz 30 window that serves as a purge space top. For example, a top chamber wall of a processing chamber serves as a purge space top in some embodiments similar to the flat surface of window bottom 606 in purge space 600. Similarly, a processing head having a substantially circular diameter comparable to or greater than the diameter of a coaxial ring hole space in accordance with the invention serves as a top boundary of a purge space in some embodiments similar to the flat surface of window bottom 606 in purge space 600.

EXAMPLE 2

A ULK thin film having a thickness of about 300 nm and containing porogens was formed on each of a series of 300 mm wafers. The ULK thin films were cured in a four-station curing chamber, as depicted in FIG. 9. During curing, purging of the curing stations was conducted in accordance with the invention. One thousand wafers were processed consecutively, whereby an intermittent cleaning of the apparatus was conducted after each group of 75 wafers. Then, physical properties of the dielectric films were measured.

Curing was conducted in a model SOLA ultraviolet thermal processing (UVTP) tool comprising a multistation sequential curing chamber, commercially available from Novellus Systems, Inc. The curing tool included four curing station units and a MKS HF-s Astron remote plasma cleaning unit contained within the curing chamber. A purge ring having specifications as described in Example 1 was mounted as depicted schematically in FIG. 7 at each of purge Stations 1-4. At Stations 1 and 2, the purge ring was made substantially from quartz. At Stations 3 and 4, the purge ring was made substantially from aluminum. Curing of the deposited dielectric film on each wafer was conducted for a total time of 14 minutes. The curing time at each of the four individual curing stations was 3.5 minutes. The quartz window at each curing station (e.g., window 518 in FIG. 7) had a diameter of approximately 16 inches and an aperture of approximately 13.5 inches. The ring hole space of the purge ring at each curing station had a diameter of about 14.4 inches. At each curing station, the purge space height between the bottom of the quartz window and the wafer surface was approximately 51 mm. The height of the purge ring wall which encompassed the ring hole space was about 19 mm; ring-pedestal gap had a gap thickness of about 19 mm; and the ring-window gap had a gap thickness of about 13 mm. The distance between the quartz window bottom and the baffle slit of the purge ring had a value of about 14 mm. The continuous baffle slit had a width of about 0.76 mm.

During curing, the pressure in the curing chamber was maintained at 20 Torr. The pedestal was heated at a temperature of 385° C. The wafer temperature was measured at 400° C. using an optical sensor. It is believed that a substantial amount of the UV energy utilized during curing is from the UVC spectrum, in the range of about from 200 nm to 300 nm. Therefore, commercially-available H+ UV bulbs were used in the UV lamps. Each of the four curing stations comprised dual UV curing lamps. The maximum electrical input power of each of two lamp heads at each curing station was 6 kW. At Station 1, the power of each of the two lamps was set at 70% of maximum during curing; at Station 2, at 100%; at Station 3, at 100%; and at Station 4, at 100%. Argon purge gas flowed through the curing chamber at a total flow rate of approximately 40 slm. Approximately 15 slm argon flowed through the purge ring at each of Stations 1 and 2; approximately 5 slm argon flowed through the purge ring at each of Stations 3 and 4. An in-line heater preheated the inlet purge gas at Stations 1 and 2 to a temperature of 200° C. Initially, 75 wafers were cured consecutively without intermittent cleaning. Then, the apparatus was cleaned by flowing $O_2$ gas for 20 minutes at a flowrate of approximately 4 slm to 5 slm through each of the purge-ring inlets at Stations 1-4 at a pressure of 500 Torr. The $O_2$ was converted to ozone, $O_3$, by setting the power levels of the UV lamps to 100 percent. Then, curing of 75 more wafers was conducted and cleaning processes repeated. The cycle of curing and cleaning was repeated until 1000 wafers had been cured with concurrent purging in accordance with the invention.

Figure 10:
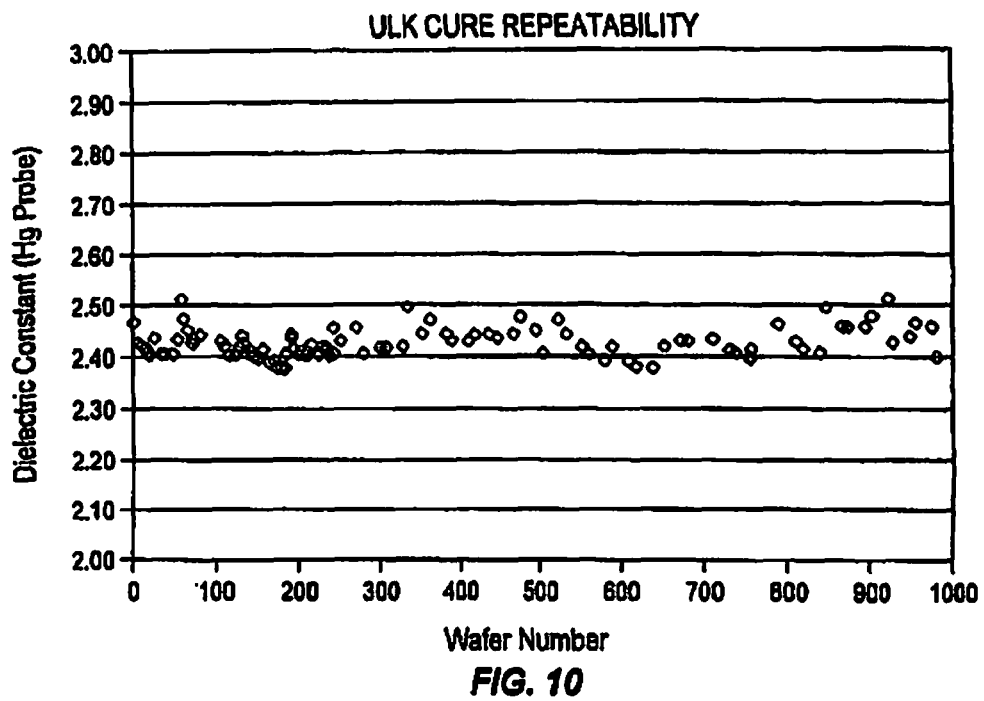
FIG. 10 contains a graph in which the dielectric constant is plotted as a function of the number of wafers cured with purging and intermittent cleaning in accordance with the invention.

After curing with purging in accordance with the invention, the dielectric constant of each of the dielectric films was measured by conventional techniques using a Hg probe. The resulting values of dielectric constant were plotted as a function of number of wafers cured. FIG. 10 contains a graph in which the dielectric constant is plotted as a function of number of wafers cured. The data show a repeatability of measured dielectric constant of approximately 0.9 percent.

EXAMPLE 3

Under conditions similar to those described with reference to Example 2 above, approximately 120 wafers containing a deposited film of dielectric material were cured with purging in accordance with the invention without intermittent cleaning.

Figure 11:
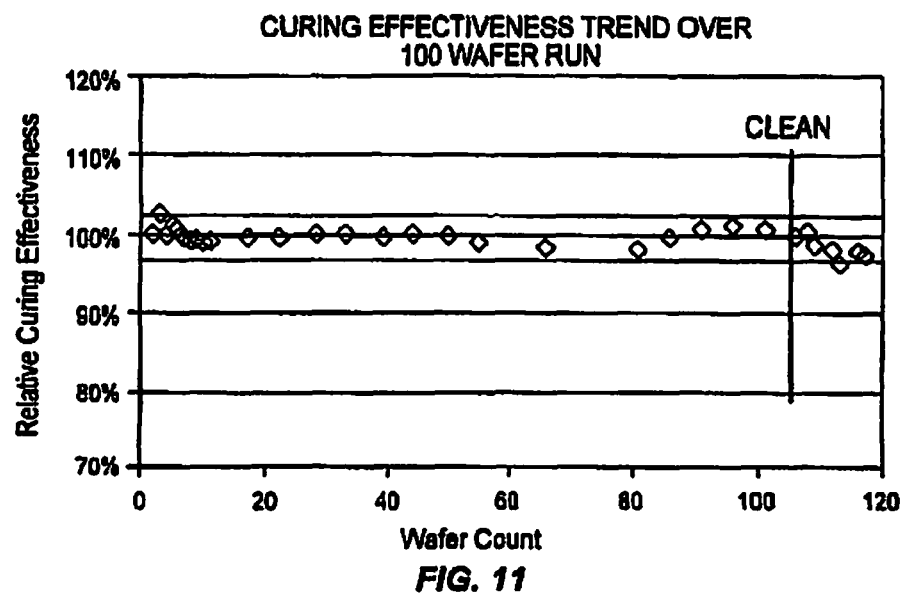
FIG. 11 contains a graph in which relative curing effectiveness is plotted as a function of wafer count for wafers cured with purging in accordance with the invention without intermittent cleaning.

After curing, the density of each of the cured dielectric films was measured by measuring film shrinkage. Film shrinkage was determined by measuring film thickness using a model Optiprobe device commercially available from Thermawave, then comparing post-curing thickness to pre-curing thickness. With the density of the dielectric film on the first cured wafer as a standard of comparison, the relative density of each of the subsequently cured films was calculated. The relative density is referred to as the relative curing effectiveness since it indicates the ability of a curing system with purging in accordance with the invention to remove porogens from successively cured dielectric films. FIG. 11 contains a graph in which relative curing effectiveness is plotted as a function of wafer count. The data of FIG. 11 show that curing effectiveness as indicated by film shrinkage was maintained.

Figures 12, 13:
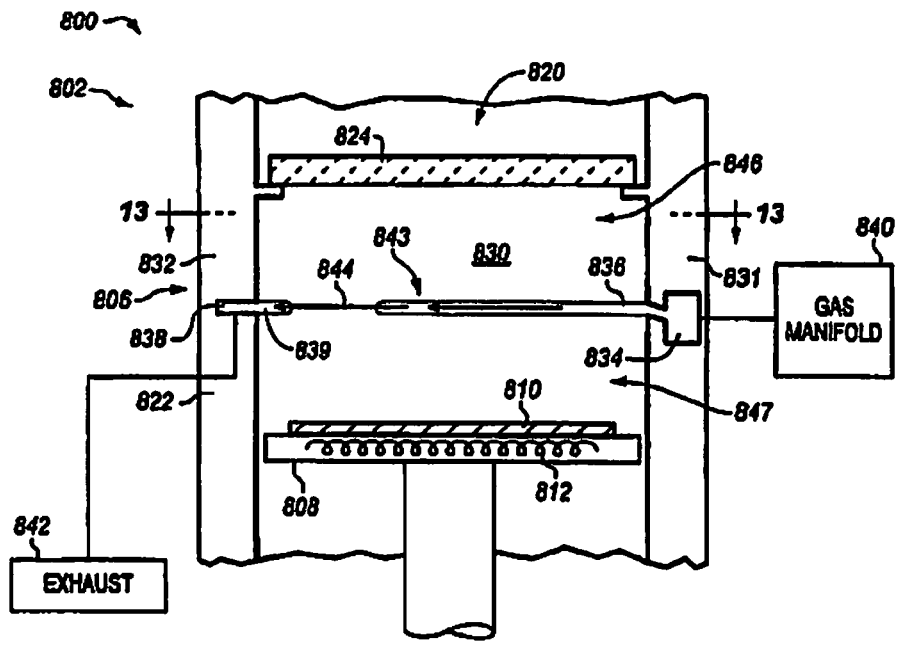
FIG. 12 depicts schematically a cross-sectional view of an integrated circuit processing apparatus that includes a gas inlet plenum and an exhaust channel located in container walls but does not include a purge ring, and which is operable to conduct purging and cleaning in accordance with the invention.
FIG. 13 depicts schematically a plan sectional view of the processing apparatus depicted in FIG. 12.

FIG. 12 depicts schematically a cross-sectional view 800 of an integrated circuit processing apparatus 802 that is operable to conduct purging and cleaning in accordance with the invention. Apparatus 802 does not include a purge ring. In apparatus 802, a gas inlet plenum and a gas exhaust channel are located in container walls instead of being located in purge ring walls. Processing apparatus 802 includes a processing container 806 that contains a pedestal 808 that is operable to hold a semiconductor wafer 810. Preferred embodiments include a pedestal heater 812 that is operable to heat a wafer 810 and also to heat other components of processing apparatus 802. Processing apparatus 802 further comprises container top 820 and container sidewalls 822. Wafer pedestal 808 functions as a container bottom. In processing apparatus 802 as depicted in FIG. 12, container top 820 includes quartz curing window 824. It is understood, however, that some embodiments in accordance with the invention do not include a quartz curing window. Container top 820, container sidewalls 822 and wafer pedestal 808 substantially define purge space 830. Container sidewalls 822 include inlet sidewall portion 831 and exhaust sidewall portion 832. Processing apparatus 802 further includes gas inlet plenum 834 and gas inlet baffle 836 located in inlet portion 831 of container sidewalls 822. Inlet baffle 836 comprises a continuous slit in inlet wall portion 831 between inlet gas plenum 834 and purge space 830. Processing apparatus 802 further includes gas exhaust channel 838 located in exhaust sidewall portion 832. Exhaust opening 839 fluidically connects purge space 830 to exhaust channel 838.

Typically, processing apparatus 802 is fluidically connected to one or more gas sources (not shown) through gas manifold 840 that provides gas to gas inlet plenum 834. Exemplary gas sources include an argon gas source, a nitrogen gas source, an oxygen gas source, and a remote plasma cleaning unit for providing radical oxygen gas, $O^-$, to processing apparatus 802. In some embodiments of a processing apparatus in accordance with the invention, purge gas and cleaning gas is preheated before entering the inlet portion of a purge ring. An exhaust pump 842 is operable to draw gas from purge space 830 through exhaust channel 838.

During purging or cleaning in accordance with the invention, gas from one or more gas sources flows through gas manifold 840 into gas inlet plenum 834, and then from gas inlet plenum 834 through gas inlet baffle 836 into purge space 830. During purging in accordance with the invention while conducting wafer processing (e.g., wafer curing), preferably gas flows from inlet baffle 836 through purge space 830 into exhaust channel 838 in a substantially planar flow region 843, as indicated by gas flow arrows 844. Preferably, during purging in accordance with the invention, gas flow in an upper buffer zone 846 between the substantially planar flow region 843 indicated by arrows 844 and container top 820 (which serves as purge space top) is substantially zero compared to the total flowrate of gas between inlet baffle 836 and exhaust opening 839. Preferably, during purging in accordance with the invention, gas flow in a lower buffer zone 847 between substantially planar flow region 843 indicated by arrows 844 and the container bottom (wafer pedestal 808) is substantially zero compared to the total flowrate of gas between inlet baffle 836 and exhaust opening 839.

Purge space 830 of processing apparatus 802 in FIG. 12 includes essentially lower buffer zone 847, planar flow region 843, and upper buffer zone 846. Thus, the purge space height in a processing apparatus comprises the distance between container top 820 and wafer pedestal 808. Typically, the purge space height is in a range of about from 35 mm to 60 mm. In an exemplary embodiment of the invention, represented in FIG. 12: the purge space height is approximately 50 mm. In an exemplary embodiment, inlet baffle 836 and exhaust inlet 839 are positioned about midway between wafer pedestal 808 and container top 820. Preferably, during purging, planar flow region 843 has a vertical thickness in a range of about from 3 mm to 8 mm.

Typically, a purge space defined by substantially cylindrical container 806 and a circular integrated circuit wafer are positioned coaxially and have substantially the same diameter. As a result, chemical species emanating from the substrate wafer tend to rise upwards into the planar flow region 843 during purging and are flushed by flowing purge gas into exhaust channel 838 out of processing chamber 806. In embodiments containing a quartz window 824 designed for wafer curing to remove porogens, the thickness of lower buffer zone 847 is selected to enhance the movement of porogens from wafer 810 into planar region 843. The thickness of upper buffer zone 846 is selected to provide a barrier to diffusion of porogens from planar flow region 843 upwards to quartz window 824. It is understood that in some embodiments, the desired flow of cleaning gas through a purge space 830 during cleaning operations is different from the desired flow of purge gas during purging operations.

FIG. 13 depicts schematically plan sectional view 850 of processing apparatus 802. As depicted in FIG. 13, container sidewalls 822 include inlet sidewall portion 831 and exhaust sidewall portion 832. Inlet plenum 834 is located in inlet sidewall portion 831 and forms an arc of about 270°. Exhaust channel 838 is located in exhaust sidewall portion 832 and forms an arc having an arc length of about 30° substantially opposite inlet plenum 834. During purging and cleaning in accordance with the invention, gas flows from inlet plenum 834 through inlet baffle 836 (FIG. 12) into purge space 830, as indicated by inlet flow arrows 852. The gas is drawn through purge space 830 by exhaust pump 842 into exhaust channel 838, as indicated by exhaust flow arrows 854.

Figure 14:
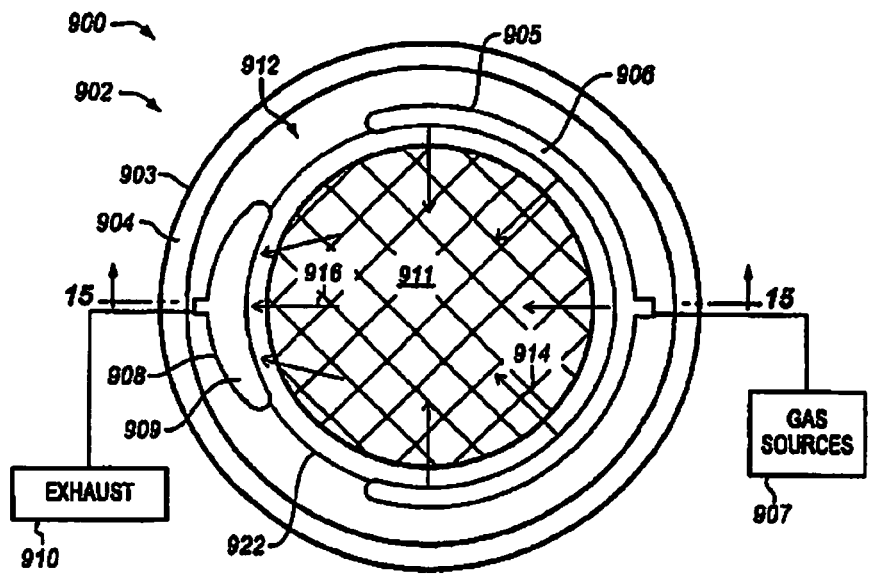
FIG. 14 depicts schematically a plan sectional view of an integrated circuit processing apparatus that includes a gas inlet plenum and an exhaust channel located within a container, but does not include a purge ring, and which is operable to conduct purging and cleaning in accordance with the invention.
Figure 15:
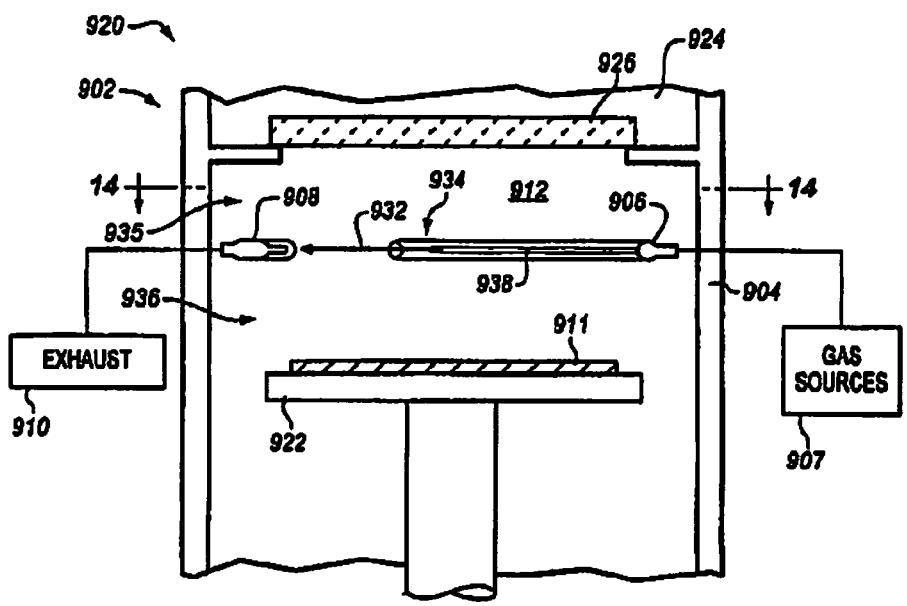
FIG. 15 depicts schematically a cross-sectional view of the apparatus depicted in FIG. 14.

FIG. 14 depicts schematically a plan sectional view 900 of an integrated circuit processing apparatus 902 that is operable to conduct purging and cleaning in accordance with the invention. Apparatus 902 does not include a purge ring. Apparatus 902 comprises a processing container 903 having container walls 904. Apparatus 902 further includes gas inlet plenum tube 905 containing inlet plenum 906, which is connected to gas sources 907. Apparatus 902 further comprises exhaust channel tube 908 containing exhaust channel 909, which is connected to exhaust pump 910. Exemplary plenum tube 905 and inlet plenum 906 form an arc having an arc length of about 270° about the outer periphery of integrated circuit wafer 911. During purging and cleaning in accordance with the invention, gas flows out of inlet plenum 906 of inlet plenum tube 905 into purge space 912, as indicated by flow arrows 914. The gas is then drawn through purge space 912 by exhaust pump 910 into exhaust channel 909, as indicated by flow arrows 916. FIG. 15 depicts schematically a cross-sectional view 920 of apparatus 902. As depicted in FIGS. 14 and 15, apparatus 902 further includes wafer pedestal 922 that is operable to hold integrated circuit wafer 911. Apparatus 902 further includes container top 924. As depicted in FIG. 15, some embodiments designed for UV curing of an integrated circuit wafer include quartz window 926 located in container top 924. Container top 924, sidewalls 904 and wafer pedestal 922 substantially define purge space 912. During purging in accordance with the invention, gas flows out of inlet plenum 906, through purge space 912, and into exhaust channel 909, as indicated by flow arrow 932. Preferably, purge gas flowing through purge space 912 flows in a substantially planar region 934 between plenum tube 905 and exhaust tube 908, as indicated by gas flow arrow 932. Preferably, during purging in accordance with the invention, gas flow in an upper buffer zone 935 between the substantially planar flow region 934 and container top 924 is substantially zero compared to the total flowrate of gas between inlet plenum 906 and exhaust channel 909. Preferably, during purging in accordance with the invention, gas flow in a lower buffer zone 936 between the substantially planar flow region 934 indicated by gas flow arrow 932 and the container bottom (wafer pedestal 922) is substantially zero compared to the total flowrate of gas between inlet plenum 906 and exhaust channel 909. It is understood that in some embodiments, the desired flow of cleaning gas through a purge space 912 during cleaning operations is different from the desired flow of purge gas during purging operations. As depicted in FIG. 15, inlet plenum tube 905 comprises gas inlet baffle 938, which is a continuous slit. In other embodiments, an inlet baffle comprises a series of perforations or holes in plenum tube 905 through which gas flows into purge space 912. As depicted in FIG. 14, exhaust channel tube 908 is located substantially opposite gas inlet baffle 938 of plenum tube 905.

Figure 16:
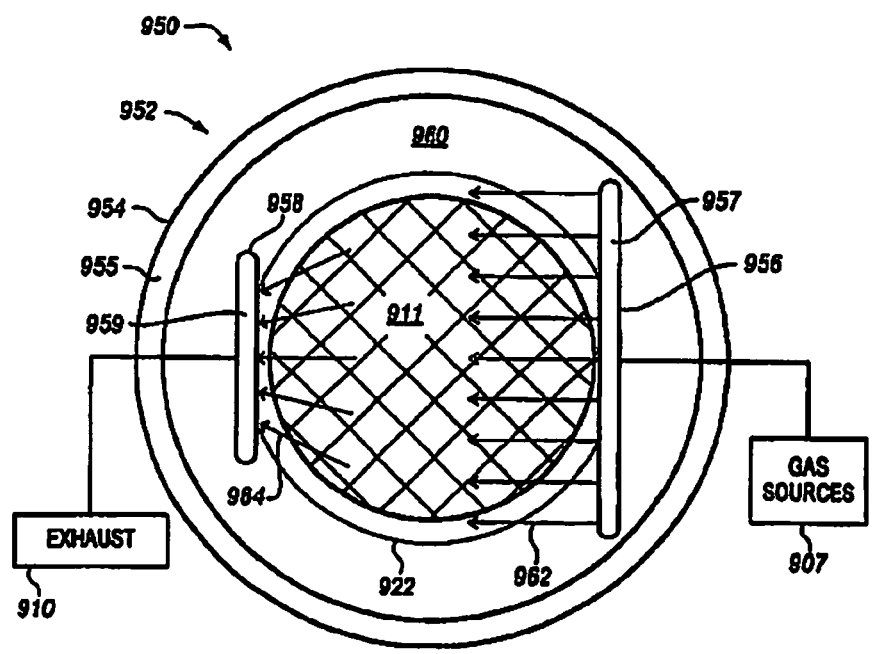
FIG. 16 depicts schematically a plan sectional view of an integrated circuit processing apparatus that includes a gas inlet plenum and an exhaust channel located within a container, but does not include a purge ring, and which is operable to conduct purging and cleaning in accordance with the invention.

FIG. 16 depicts schematically a plan sectional view 950 of an integrated circuit processing apparatus 952 that is operable to conduct purging and cleaning in accordance with the invention. Apparatus 952 does not include a purge ring. Apparatus 952 comprises a processing container 954 having container walls 955. Apparatus 952 further includes gas inlet plenum tube 956 containing gas inlet plenum 957, which is connected to gas sources 907. Apparatus 902 further comprises exhaust channel tube 958 containing exhaust channel 959 connected to exhaust pump 910. An exemplary plenum tube 956 is mounted in processing container 954 so that it is located at a peripheral edge of an integrated circuit wafer 911 when the wafer is present on wafer pedestal 922. An exemplary plenum tube 956, as depicted in FIG. 16, comprises a substantially straight tube having a length comparable to the diameter of integrated circuit wafer 911. In other embodiments of an apparatus in accordance with the invention, an inlet plenum tube has a radius of curvature comparable to that of integrated circuit wafer 911 and it forms an arc having an arc length in a range of about from 90° to 270° about the outer periphery of integrated circuit wafer 911. During purging and cleaning in accordance with the invention, gas flows out of inlet plenum 957 of inlet plenum tube 956 into purge space 960, as indicated by flow arrows 962. The gas is then drawn through purge space 960 by exhaust pump 910 into exhaust channel 959 of exhaust channel tube 958, as indicated by flow arrows 964. In some embodiments, inlet plenum tube 956 comprises a gas inlet baffle that is a continuous slit. In other embodiments, an inlet baffle comprises a series of perforations or holes in plenum tube 956 through which gas flows into purge space 960. Gas inlet plenum tube 906 of system 902 (FIGS. 14, 15) was described as an arc-shaped tube. Gas plenum tube 956 of apparatus 952 (FIG. 16) was described as a substantially straight tube. It is understood, however, that gas inlet plenum tubes in accordance with the invention include tubes having shapes different from those described herein. For example, in some embodiments, a gas inlet plenum tube has a wide V-shape.

Each of gas inlet plenums 120, 834, 906 and 957 described in the specification is a single continuous plenum. It is understood, however, that in some embodiments in accordance with the invention, two or more smaller or shorter plenums perform the function of a single, larger and longer plenum described herein. Regardless of particular shape or configuration, the total length of a single plenum or of a plurality of plenums in a system for purging and/or cleaning a processing apparatus in accordance with the invention generally comprises at least the length of one diameter of the wafer-size for which the processing apparatus was designed. For example, in an apparatus designed for processing a 300 mm wafer, the length (i.e., the long dimension depicted in FIGS. 1, 13, 14 and 16) of a gas inlet plenum (or of a plurality of plenums) generally is about 300 mm or more. For example, in an embodiment such as system 952 described with reference to FIG. 16, plenum 957 has a length of about one wafer diameter or more. In embodiments such as purge ring 102 and systems 602, 802 and 902, in which the plenum comprises an arc-shaped structure, the total plenum length typically has a total length between about one wafer diameter and about 3 wafer diameters. Accordingly, when the gas inlet baffle comprises a continuous slit in a single plenum or in each of a plurality of plenums, then the total length of the baffle slit (or baffle slits) comprises a length of about one diameter or more of the wafer size for which the apparatus was designed. Embodiments in accordance with the invention also include systems and methods in which the total inlet plenum length is less than about one diameter. It is believed, however, that such embodiments provide less uniform flow, without recirculation, of gas from the gas inlet baffle through the purge space into the exhaust channel than embodiments in which the total plenum length is greater.

The total open area of flow of a gas inlet baffle (or a plurality of baffles) typically is at least about 4 $cm^2$. The total open cross-sectional area open to flow of an exhaust channel opening (or a plurality of exhaust openings) (e.g., exhaust opening 839, FIG. 12) typically is greater than about 20 cm².

The particular systems, designs, methods and compositions described herein are intended to illustrate the functionality and versatility of the invention, but should not be construed to be limited to those particular embodiments. Systems and methods in accordance with the invention are useful in a wide variety of circumstances and applications to reduce undesired deposition of material in semiconductor processing equipment. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the devices, systems, methods and compositions described in the claims below and by their equivalents.

What is claimed is:

1. A purge ring for providing a gas to a wafer processing chamber, the purge ring comprising:
    an inlet ring wall defining a ring hole space, wherein an outer perimeter of the inlet ring wall is elliptical and an outer perimeter of the ring hole space is circular, and wherein the inlet ring wall corresponds to a continuous structure surrounding the ring hole space;
    an inlet baffle formed within the inlet ring wall and surrounding at least 180 degrees of the outer perimeter of the ring hole space;
    an inlet plenum arranged in a first end of the inlet ring wall, the inlet plenum arranged to provide the gas received via a gas inlet hole to the ring hole space through the inlet baffle;
    an exhaust channel formed within the inlet ring wall in a second end of the inlet ring wall opposite the first end; and
    an exhaust outlet hole arranged in the second end of the inlet ring wall to exhaust the gas out of the ring hole space via the exhaust channel,
    wherein the inlet baffle surrounds at least 270 degrees of the outer perimeter of the ring hole space.

2. The purge ring of claim 1, wherein the inlet plenum is arranged to receive the gas and the exhaust outlet hole is arranged to exhaust the gas in a first direction perpendicular to a second direction of flow of the gas from the inlet plenum to the exhaust outlet hole.

3. The purge ring of claim 1, wherein a width of the inlet plenum increases from the gas inlet hole to the inlet baffle.

4. The purge ring of claim 1, wherein a width of the exhaust channel decreases from the ring hole space to the exhaust outlet hole.

5. The purge ring of claim 1, wherein the inlet baffle includes a continuous slit surrounding at least 270 degrees of the outer perimeter of the ring hole space.

6. The purge ring of claim 1, wherein the inlet baffle includes a slit that fluidly connects the inlet plenum to the ring hole space.

7. The purge ring of claim 6, wherein the slit slants upward from the inlet plenum to the ring hole space.

8. The purge ring of claim 1, wherein the inlet baffle includes a plurality of slots surrounding at least 270 degrees of the outer perimeter of the ring hole space.

9. The purge ring of claim 1, wherein the purge ring further comprises:
    a lower part including separate first and second recessed portions; and
    an upper part including the gas inlet hole and the exhaust outlet hole,
    wherein the upper part is arranged on top of the lower part, the first recessed portion and the upper part define the inlet plenum, and the second recessed portion and the upper part define the exhaust channel.

* * * * *